United States Patent [19]
Kito et al.

[11] Patent Number: 6,151,351
[45] Date of Patent: *Nov. 21, 2000

[54] DISTRIBUTED FEEDBACK SEMICONDUCTOR LASER AND METHOD FOR PRODUCING THE SAME

[75] Inventors: Masahiro Kito, Toyonaka; Masato Ishino, Shijyonawate; Nobuyuki Otsuka, Kawanishi; Yasushi Matsui, Neyagawa; Shinji Nakamura, Ikoma, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/534,959

[22] Filed: Sep. 28, 1995

[30] Foreign Application Priority Data

Sep. 28, 1994 [JP] Japan .................................. 6-233837
Feb. 3, 1995 [JP] Japan .................................. 7-016863

[51] Int. Cl.$^7$ .............................. H01S 3/085; H01S 3/19
[52] U.S. Cl. ................................................ 372/96; 372/45
[58] Field of Search .................................. 372/96, 50, 45

[56] References Cited

U.S. PATENT DOCUMENTS

| | | | |
|---|---|---|---|
| 5,208,824 | 5/1993 | Tsang ......................................... | 372/45 |
| 5,274,660 | 12/1993 | Abe ........................................... | 372/96 |
| 5,289,494 | 2/1994 | Tade et al. ................................ | 372/45 |
| 5,319,666 | 6/1994 | Ackerman ................................. | 372/96 |
| 5,329,542 | 7/1994 | Westbrook ................................ | 372/96 |
| 5,394,429 | 2/1995 | Yamada et al. .......................... | 372/96 |
| 5,539,766 | 7/1996 | Ishino et al. .............................. | 372/45 |

FOREIGN PATENT DOCUMENTS

| | | |
|---|---|---|
| 0507956A1 | 10/1992 | European Pat. Off. . |
| 0513745A3 | 11/1992 | European Pat. Off. . |
| 0601890A1 | 6/1994 | European Pat. Off. . |
| 4429586A1 | 2/1995 | Germany . |
| 1-106489 | 4/1989 | Japan . |
| 1-319986 | 12/1989 | Japan . |
| 2-143580 | 6/1990 | Japan . |
| 2-159086 | 6/1990 | Japan . |
| 3145780 | 6/1991 | Japan . |
| 3147386 | 6/1991 | Japan . |
| 6164051 | 6/1994 | Japan . |
| 2146259 | 4/1985 | United Kingdom . |

OTHER PUBLICATIONS

Aoki et al, "InGaAs/InGaAsP MQW electroabsorption Modulator Integrated with a DFB Laser Fabricated by Band–Gap Energy Control Selective Area MOCVD", IEEE Journal of Quantum Electronics, vol. 29, No. 6, pp. 2088–2096, Jun. 1993.

Sasaki et al, "10 Wavelength MQW–DBR Lasers Fabricated By Selective MOVPE Growth", Electronics Letters, vol. 30, No. 10, pp. 785–786, May 12, 1994.

H. Kogelnik et al., "Coupled–Wave Theory of Distributed Feedback Lasers", *J. appl. Phys.*, vol. 43, No. 5, pp. 2327–2335, 1972.

W.T. Tsang et al., "Long–Wavelength InGaAsP/InP Distributed Feedback Lasers Incorporating Gain–Coupled Mechanism", *IEEE Photonics Technology Letters*, vol. 4, No. 3, pp. 212–215, 1992.

(List continued on next page.)

*Primary Examiner*—James W. Davie
*Attorney, Agent, or Firm*—Ratner & Prestia

[57] ABSTRACT

In a distributed feedback semiconductor laser includes an InP substrate and a multiple layer structure formed on a main surface of the InP substrate, the multiple layer structure includes at least an active layer for emitting laser light and a periodical structure for distributed feedback of the laser light, and the periodical structure includes a plurality of semiconductor regions each having a triangular cross section in a direction perpendicular to the main surface of the InP substrate and parallel to a cavity length of the distributed feedback semiconductor laser, the triangular cross section projecting toward the InP substrate.

45 Claims, 25 Drawing Sheets

OTHER PUBLICATIONS

D.H. Jang et al., "inAsP phase formations during the growth of a GaInAsP/InP distributed feedback laser diode structure on corrugated InP using metalorganic vapor phase epitaxy", *Appl. Phys. Lett.*, vol. 66, No. 23, pp. 3191–3193, 1995.

Y. Luo et al., "Purely gain–coupled distributed feedback semiconductor lasers", *Appl. Phys. Lett.*, vol. 56, No. 17, pp. 1620–1622, 1990.

K. H. Huang & B.W. Wessels, "Growth and Properties of InAsP Alloys Prepared by Organometallic Vapor Phase Epitaxy", Journal of Crystal Growth 92(1988) pp. 547–552.

T. Tanburn–Ek, R. A. Logan, S.N.G. Chu, A.M. Sergent, and K.W. Wecht, "Effects of strain in multiple quantum well distributed feedback lasers", Applied Physics Letters 57 (1990) No. 21, New York, NY.

Partial European Search Report for EP 95 11 5272, dated Jan. 10, 1996.

(1) Masahiro Aoki et al., "InGaAs/InGaAsP MQW Electro-absorption Modulator Integrated with a DFB Laser Fabricated by Band–Gap Energy Control Selective Area MOCVD," IEEE Journal of Quantum Electronics, Jun. 29, 1993, No. 6, NY, NY, pp. 2088–2096.

(2) SI. Weimin et al., "Theoretical Analysis of DFB Laser Integrated with EA Modulator," 2419A International Conference on Solid State Devices & Materials, Aug. 23, 1994, Yokohama, Japan, (1994), pp. 247–249.

(5) T. Sasaki et al., "10 wavelength MQW–DRB lasers fabricated by selective MOVPE growth," Electronics Letters, vol. 30, (May 12, 1994), No. 10, Stevenage, Herts, GB, pp. 785–786.

European Search Report 95115272.7 dated Sep. 24, 1996.

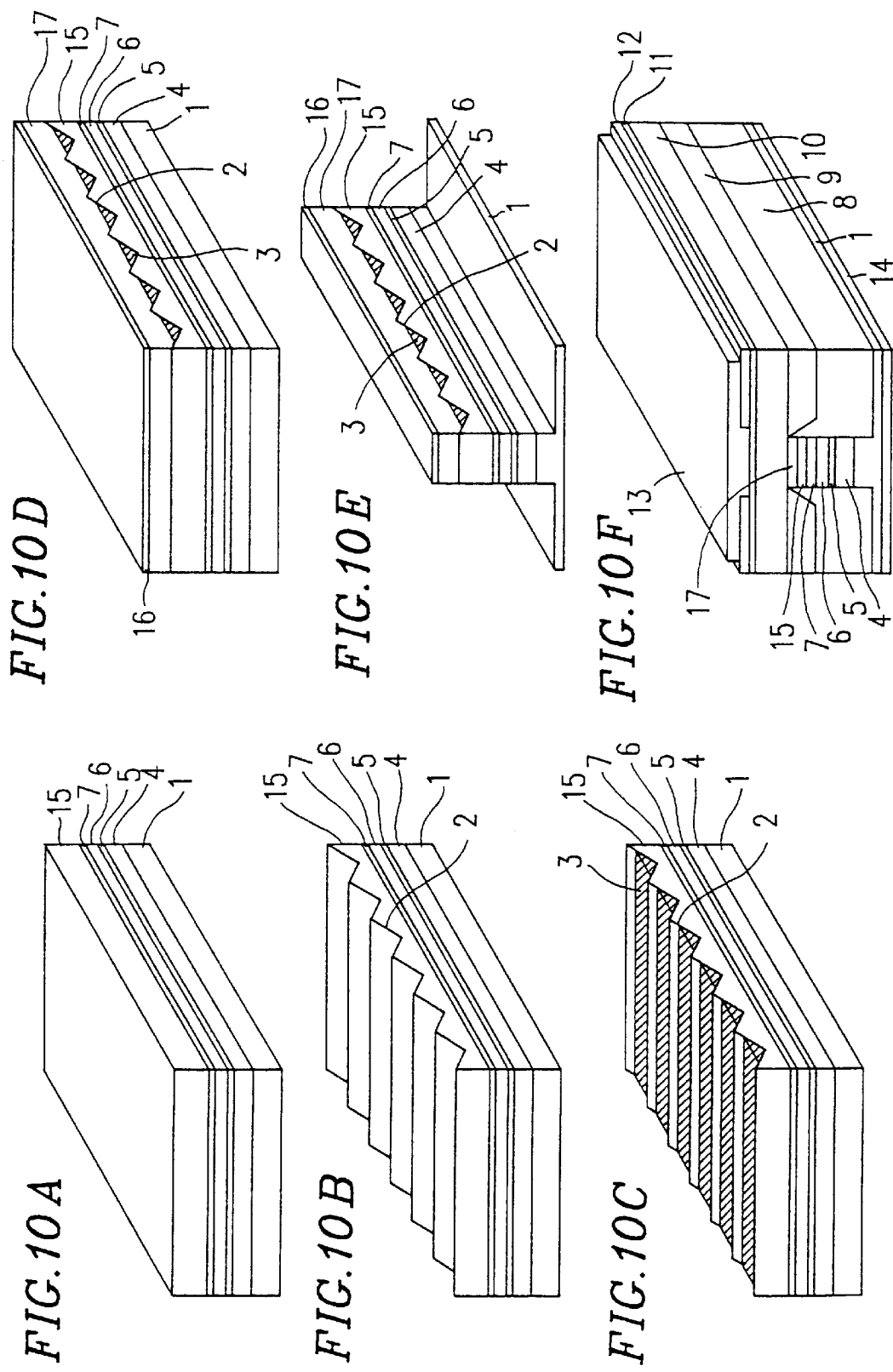

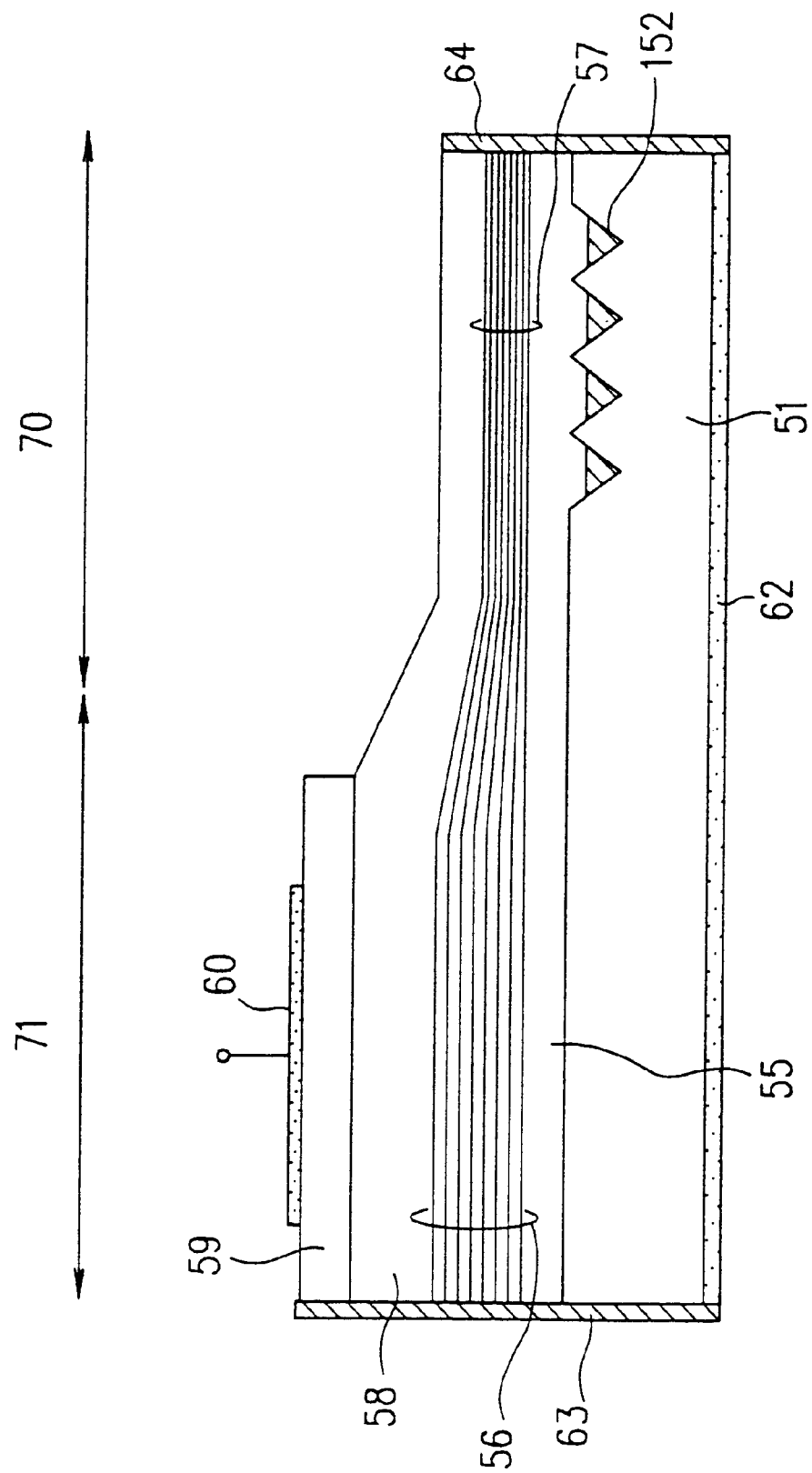

DISTRIBUTED FEEDBACK SEMICONDUCTOR LASER AND METHOD FOR PRODUCING THE SAME

BACKGROUND OF THE INVENTION

1. Field of the Invention

The present invention relates to a distributed feedback semiconductor laser suitable as a light source for long distance and large capacity optical data communication, and a method for producing the same.

2. Description of the Related Art

Recently, distributed feedback semiconductor lasers (hereinafter, referred to as "DFB lasers") have been put into practical use as light sources for long distance and large capacity optical data communication and multi-channel video data transmission such as CATV. The DFB lasers emit light having a single wavelength and thus have such advantages as high response speed and low noise. As a result of such advantages, the DFB lasers are in wide use as light sources for optical data communication. Two methods for causing distributed feedback of light have been theoretically shown by, for example, Kogelnik ("Coupled-Wave Theory of Distributed Feedback Lasers", Journal of Applied Physics, vol. 43, page 2327, 1972).

One of the methods is a refractive index coupled system, by which the semiconductor laser is structured so that the refractive index periodically changes in the cavity length direction, and generates laser oscillation having a wavelength corresponding to the period of change (Bragg wavelength and the vicinity thereof). A great number of DFB lasers produced by this method have been reported because of ease in performing the method. However, in a DFB laser produced by this method, laser oscillation theoretically occurs in either one of the two laser oscillation modes which interpose the Bragg wavelength and thus involves a high possibility that laser oscillation occurs in both of the two oscillation modes.

The other method is a gain coupled system, by which the semiconductor laser is structured so that the gain periodically changes in the cavity length direction, and generates laser oscillation having a wavelength corresponding to the period of change (Bragg wavelength). In a DFB laser produced in this method, oscillation theoretically occurs only at the Bragg wavelength and thus has a high possibility that laser oscillation has a single wavelength. However, a DFB laser having satisfactory characteristics has not been produced since the advent of the theory because of difficulties associated with performing the method.

Recently, a method for producing a DFB laser has been proposed whereby the gain is periodically changed by providing an absorption layer periodically in the semiconductor laser to generate satisfactory laser oscillation ("Long-Wavelength InGaAsP/InP Distributed Feedback Lasers Incorporating Gain-Coupled Mechanism", Photonics Technology Letters, vol. 4, page 212, 1992). FIG. 18 is a cross sectional view of a DFB laser having such a structure. N-type InGaAsP absorption layers 23 are buried periodically between n-type InP layers 21, 24 and 25, and an n-type InGaAsP optical waveguide layer 26, an active layer 29, a p-type InGaAsP optical waveguide layer 30, and a p-type InP cladding layer 31. A bandgap energy of the n-type InGaAsP absorption layer 23 is set to be smaller than the emission energy from the active layer 29. Accordingly, the n-type InGaAsP optical waveguide layer 26 absorbs emission from the active layer 29 periodically to cause a periodical change in the gain. Thus, there is a high possibility that a laser oscillation having a single wavelength is produced.

A method for producing the DFB laser shown in FIG. 18 will be described with reference to FIGS. 19A, 19B and 19C.

As is shown in FIG. 19A, the n-type InGaAsP absorption layer 23 and an n-type InP passivation layer 24 are grown sequentially on an n-type InP substrate 21 by a first step of crystal growth. Then, as is shown in FIG. 19B, prescribed areas of the n-type InGaAsP absorption layer 23 are etched to form a diffraction grating 22 having a plurality of areas of the n-type InGaAsP absorption layers 23 arranged periodically. Then, as is shown in FIG. 19C, an n-type InP cladding layer 25 is deposited by a second step of crystal growth to bury the n-type InGaAsP absorption layer 23.

This method requires etching the n-type InGaAsP absorption layer 23 once. A surface of the n-type InGaAsP absorption layer 23 exposed by etching is subjected to heating by the second step of crystal growth. Because of such heating, the exposed surface can be undesirably defected which degrades not only the optical characteristics of the n-type InGaAsP absorption layer 23, but also the reliability of the DFB laser regarding the performance over a long period of time.

The "wavelength chirp", which is generated by direct modulation of the semiconductor laser is a serious problem associated with long-distance and large capacity data communication. For further improvement in the data transmission characteristics, a light source having a lower level of wavelength chirp is desired.

SUMMARY OF THE INVENTION

In one aspect of the present invention, in a distributed feedback semiconductor laser including an InP substrate and a multiple layer structure formed on a main surface of the InP substrate, the multiple layer structure includes at least an active layer for emitting laser light and a periodical structure for distributed feedback of the laser light, and the periodical structure includes a plurality of semiconductor regions each having a triangular cross section in a direction perpendicular to the main surface of the InP substrate and parallel to a cavity length of the distributed feedback semiconductor laser, the triangular cross section projecting toward the InP substrate.

In one embodiment of the invention, the periodical structure is provided between the InP substrate and the active layer.

In one embodiment of the invention, the semiconductor regions are set to have a bandgap energy which is smaller than the energy of light emitted from the active layer.

In one embodiment of the invention, the semiconductor regions are set to have a bandgap energy which is at least equal to the energy of light emitted from the active layer.

In one embodiment of the invention, the semiconductor regions are provided in an InP cladding layer.

In one embodiment of the invention, the semiconductor regions are provided between an InP cladding layer and an InGaAsP optical waveguide layer.

In one embodiment of the invention, the active layer has a quantum well structure including at least a well layer and a barrier layer.

In one embodiment of the invention, a compression strain is induced into the well layer.

In one embodiment of the invention, the compression strain is induced at 0.5 to 1.5%.

In one embodiment of the invention, the semiconductor regions are formed of InAsP.

In one embodiment of the invention, the semiconductor regions are formed at least of a first semiconductor material having a bandgap energy which is smaller than the energy of light emitted from the active layer and a second semiconductor material having a bandgap energy which is larger than the energy of the light.

In one embodiment of the invention, the semiconductor regions are formed at least of a first semiconductor material having a bandgap energy which is smaller than the energy of light emitted from the active layer and a second semiconductor material having a bandgap energy which is larger than the energy of the light.

In one embodiment of the invention, the semiconductor regions have an average refractive index which is substantially equal to the refractive index of InP.

In one embodiment of the invention, the first semiconductor material is InAsP, and the second semiconductor material is InGaP.

In another aspect of the present invention, a method for producing a distributed feedback semiconductor laser includes the steps of periodically forming a plurality of grooves at a surface of an InP substrate; heating the InP substrate in an atmosphere containing at least a mixture of phosphine and arsine to grow an InAsP layer in each of the grooves; and forming a multiple layer structure including an active layer on the InP substrate, covering the InAsP layers.

In still another aspect of the present invention, a method for producing a distributed feedback semiconductor laser includes the steps of forming a multiple layer structure on an InP substrate, the multiple layer including an active layer and an InP top layer; periodically forming a plurality of grooves at a surface of the InP top layer; and heating the multiple layer structure in an atmosphere containing at least a mixture of phosphine and arsine to grow an InAsP layer in each of the grooves.

In one embodiment of the invention, the method further includes the step of growing an InGaP layer on the InAsP layers before the formation of the multiple layer structure.

In one embodiment of the invention, the method further includes the step of growing an InGaP layer on the InAsP layers.

In still another aspect of the present invention, in a distributed feedback semiconductor laser including an InP substrate and a multiple layer structure formed on a main surface of the InP substrate, the multiple layer structure includes at least an active layer for emitting laser light and a periodical structure for distributed feedback of the laser light, and the periodical structure includes a plurality of semiconductor regions each having a triangular cross section in a direction perpendicular to the main surface of the InP substrate and parallel to a cavity length of the distributed feedback semiconductor laser, the triangular cross section projecting toward the InP substrate.

In one embodiment of the invention, the semiconductor regions are formed at least of a first semiconductor material having a bandgap energy which is smaller than the energy of light emitted from the active layer and a second semiconductor material having a bandgap energy which is larger than the energy of the light.

In one embodiment of the invention, the semiconductor regions are provided between the InP substrate and the active layer.

In still another aspect of the present invention, a crystal growth method includes corrugating a surface of a layer formed of InP crystals by etching; and heating the InP crystals in an atmosphere including at least a mixture of phosphine and arsine to grow an InAsP layer in grooves of the corrugated surface.

In still another aspect of the present invention, in a distributed feedback semiconductor laser including an InP substrate and a multiple layer structure formed on a main surface of the InP substrate, the multiple layer structure includes at least an active layer for emitting laser light and a periodical structure for treating the laser light with distributed feedback, the periodical structure includes a plurality of first semiconductor regions and a plurality of second semiconductor regions arranged alternately in a direction of a cavity length of the distributed feedback semiconductor laser, and the first semiconductor regions each have a triangular cross section in a direction perpendicular to the main surface of the InP substrate and parallel to the cavity length, the triangular cross section projecting toward the InP substrate.

In one embodiment of the invention, the first semiconductor regions are set to have a bandgap energy which is smaller than the energy of light emitted from the active layer and the second semiconductor regions are set to have a bandgap energy which is larger than the energy of the light.

In one embodiment of the invention, the first and the second semiconductor regions are formed in an InP cladding layer.

In one embodiment of the invention, the first and the second semiconductor regions are formed between an InP cladding layer and an InGaAsP optical waveguide layer.

In one embodiment of the invention, the first semiconductor regions are formed of InAsP, and the second semiconductor regions are formed of InGaP.

In still another aspect of the present invention, a distributed feedback semiconductor laser includes a striped multiple layer structure including a light emission part for emitting laser light and a modulation part which is optically coupled with the emission part for modulating the laser light; and a semiconductor substrate for supporting the striped multiple layer structure. The emission part includes a gain coupled cavity having an active layer and an absorption type diffraction grating which absorbs light from the active layer at an absorbance periodically changing in a direction of an optical axis, and The modulation part includes a light modulation layer having optical characteristics which changes in accordance with a modulation signal.

In one embodiment of the invention, the striped multiple layer structure includes a multiple quantum well layer, the active layer in the emission part includes a first part of the multiple quantum well layer, and the light modulation layer in the modulation part includes a second part of the multiple quantum well layer.

In one embodiment of the invention, the active layer in the emission part and the light modulation layer in the modulation part are connected to each other by a third part of the multiple quantum well layer located between the first part and the second part.

In one embodiment of the invention, the first part of the multiple quantum well layer is thicker than the second part of the multiple quantum well layer.

In one embodiment of the invention, the absorption type diffraction grating includes a plurality of light absorption layers arranged in the direction of the optical axis.

In one embodiment of the invention, the diffraction grating includes a plurality of light absorption layers which have a thickness changing periodically in the direction of the optical axis and have a bandgap changing periodically in the direction of the optical axis in accordance with the periodical change in the thickness.

In one embodiment of the invention, the light absorption layers have a quantum well structure.

In one embodiment of the invention, the light absorption layers are grown on periodical corrugations formed at a surface of the semiconductor substrate.

In one embodiment of the invention, the absorption type diffraction grating is provided between the active layer and the semiconductor substrate.

In one embodiment of the invention, the active layer is provided between the absorption type diffraction grating and the semiconductor substrate.

In one embodiment of the invention, the distributed feedback semiconductor laser further includes an optical waveguide layer provided between the active layer and the absorption type diffraction grating.

In one embodiment of the invention, the distributed feedback semiconductor laser further includes a first voltage application device for applying a substantially constant voltage to the emission part and a second voltage application device for applying a modulation voltage to the modulation part.

In one embodiment of the invention, the light absorption layers are formed of InAsP.

In still another aspect of the present invention, a distributed feedback semiconductor laser includes a semiconductor substrate having a first cladding layer of a first conductivity type having a bandgap $\lambda g1$; and a striped multiple layer structure including a first part and a second part which are optically coupled to each other due to continuity of the striped multiple layer structure along an identical optical axis. The first part includes a cavity structure including an active layer having a bandgap wavelength $\lambda g2$, an optical waveguide layer of the first conductivity type having a bandgap wavelength $\lambda g3$, a second cladding layer of a second conductivity type having a bandgap wavelength $\lambda g1$, and a light absorption layer which has a bandgap wavelength $\lambda g4$, and is buried between the optical waveguide layer and the semiconductor substrate to form an absorption type diffraction grating periodical in a direction of an optical axis. The second part includes a light modulation layer having a bandgap wavelength $\lambda g5$, and a third cladding layer of the second conductivity type having a bandgap wavelength $\lambda g1$, both of which are grown in a different growth step from the active layer, the optical waveguide layer, the second cladding layer, and the light absorption layer in the first part. The bandgap wavelengths have the relationship of $\lambda g4 > \lambda g2 > \lambda g3 > \lambda g1$ and $\lambda g2 > \lambda g5 > \lambda g1$. A Bragg wavelength $\lambda_B$ determined by an effective refractive index of the cavity in the first part and the periodicity of the absorption type diffraction grating is set in a range including $\lambda g2$.

In still another aspect of the present invention, a distributed feedback semiconductor laser includes a semiconductor substrate having a first cladding layer of a first conductivity type having a bandgap $\lambda g1$; and a striped multiple layer structure including a first part and a second part which are optically coupled to each other due to continuity of the striped multiple layer structure along an identical optical axis. The first part includes a cavity structure including a multiple quantum well active layer having a bandgap wavelength $\lambda g2$, a first optical waveguide layer of the first conductivity type having a bandgap wavelength $\lambda g3$, a second cladding layer of a second conductivity type having a bandgap wavelength $\lambda g1$, and a quantum well light absorption layer which has a bandgap wavelength $\lambda g4$ and is buried between the first optical waveguide layer and the semiconductor substrate to form an absorption type diffraction grating periodical in a direction of the optical axis. The second part includes a buried quantum well layer having a bandgap wavelength $\lambda g6$, a second optical waveguide layer having a bandgap wavelength $\lambda g2$, a multiple quantum well light modulation layer having a bandgap wavelength $\lambda g5$, and a third cladding layer of the second conductivity type having a bandgap wavelength $\lambda g1$. The quantum well light absorption layer in the first part and the buried quantum well layer in the second part are formed in the same growth step simultaneously, the first optical waveguide layer in the first part and the second optical waveguide layer in the second part are formed in the same growth step simultaneously, the multiple quantum well active layer in the first part and the multiple quantum well light modulation layer in the second part are formed in the same growth step simultaneously, and the second cladding layer in the first part and the third cladding layer in the second part are formed in the same growth step simultaneously. The bandgap wavelengths have the relationship of $\lambda g4 > \lambda g2 > \lambda g3 > \lambda g1$, $\lambda g6 < \lambda g4$, and $\lambda g5 < \lambda g2$. A Bragg wavelength $\lambda_B$ determined by an effective refractive index of the cavity in the first part and the periodicity of the absorption type diffraction grating is set in a range including $\lambda g2$.

In still another aspect of the present invention, a distributed feedback semiconductor laser includes a semiconductor substrate having a first cladding layer of a first conductivity type having a bandgap $\lambda g1$; and a striped multiple layer structure including a first part and a second part which are optically coupled to each other due to continuity of the striped multiple layer structure along an identical optical axis. The first part includes a cavity structure including a multiple quantum well active layer having a bandgap wavelength $\lambda g2$, a first optical waveguide layer of the first conductivity type having a bandgap wavelength $\lambda g3$, a second cladding layer of a second conductivity type having a bandgap wavelength $\lambda g1$, and a quantum well light absorption layer which is buried between the first optical waveguide layer and the first cladding layer to form an absorption type diffraction grating. The quantum well light absorption layer has a thickness which periodically changes thus to periodically change the bandgap wavelength thereof, and the thickness and the composition of the quantum well light absorption layer are set so that the bandgap has a maximum value larger than $\lambda g2$ and a minimum value smaller than $\lambda g2$. The second part includes a quantum well layer having a bandgap wavelength $\lambda g5$, a second optical waveguide layer having a bandgap wavelength $\lambda g3$, a multiple quantum well light modulation layer having a bandgap wavelength $\lambda g6$, and a third cladding layer of the second conductivity type having a bandgap wavelength $\lambda g1$. The buried quantum well light absorption layer in the first part and the quantum well layer in the second part are formed in the same growth step simultaneously, the first optical waveguide layer in the first part and the second optical waveguide layer in the second part are formed in the same growth step simultaneously, the multiple quantum well active layer in the first part and the multiple quantum well light modulation layer in the second part are formed in the same growth step simultaneously, and the second cladding layer in the first part and the third cladding layer in the second part are formed in the same growth step simultaneously. The bandgap wavelengths have the relationship of $\lambda g4 > \lambda g2 > \lambda g3 \geq \lambda g1$, $\lambda g5 < \lambda g2$, and $\lambda g6 < \lambda g2$. A Bragg wavelength $\lambda_B$ determined by an effective refractive index of the cavity in the first part and the periodicity of the absorption type diffraction grating is set in a range including $\lambda g2$.

In still another aspect of the present invention, a distributed feedback semiconductor laser includes a semiconductor substrate having a first cladding layer of a first conductivity type having a bandgap $\lambda g1$; and a striped multiple layer structure including a first part and a second part which are optically coupled to each other due to continuity of the striped multiple layer structure along an identical optical axis. The first part includes a cavity structure including an active layer having a bandgap wavelength $\lambda g2$, an optical waveguide layer of the first conductivity type having a bandgap wavelength $\lambda g3$, a second cladding layer of a second conductivity type having a bandgap wavelength $\lambda g1$, a first spacer layer which has a bandgap wavelength of $\lambda g1$ and is provided between the optical waveguide layer and the active layer, and a light absorption layer which has a bandgap wavelength $\lambda g4$ and is buried in the second cladding layer to form an absorption type diffraction grating periodical in a direction of the optical axis. The second part includes a light modulation layer having a bandgap wavelength $\lambda g5$, a third cladding layer of the second conductivity type having a bandgap wavelength $\lambda g1$, and a second spacer layer which has a bandgap wavelength of $\lambda g1$ and is provided between the light modulation layer and the third cladding layer. The optical waveguide layer in the first part and the light modulation layer in the second part are formed in the same growth step simultaneously, and the first spacer layer in the first part and the second spacer layer in the second part are formed in the same growth step simultaneously. The bandgap wavelengths have the relationship of $\lambda g4 > \lambda g2 > \lambda g3 > \lambda g1$ and $\lambda g2 > \lambda g5 > \lambda g1$. A Bragg wavelength $\lambda_B$ determined by an effective refractive index of the cavity in the first part and the periodicity of the absorption type diffraction grating is set in a range including $\lambda g2$.

In still another aspect of the present invention, a semiconductor laser includes: a striped multiple layer structure including a light emission part for emitting laser light and an optical waveguide part which is optically coupled with the light emission part for propagating the laser light therethrough; and a semiconductor substrate for supporting the striped multiple layer structure. The light emission part includes an active layer radiating the laser light, the waveguide part includes a Bragg reflector where a refractive index periodically changes along an optical axis direction, and the Bragg reflector includes an InAsP layer formed in a concave part of periodic corrugations formed on the semiconductor substrate so as to reflect light having a selected wavelength of the laser light radiated from the active layer of the emission part toward the active layer.

In one embodiment of the invention, the InAsP layer has a bandgap energy not to absorb the laser light.

In one embodiment of the invention, the optical waveguide part includes a wavelength tuning part for adjusting a wavelength of the laser light.

In one embodiment of the invention, the optical waveguide part includes a phase control part for adjusting a phase of the laser light.

Thus, the invention described herein makes possible the advantages of providing a DFB laser for causing laser oscillation having a single wavelength, maintaining the oscillation mode against returning light from outside the DFB laser, and withstanding noise; and a method for producing the same.

These and other advantages of the present invention will become apparent to those skilled in the art upon reading and understanding the following detailed description with reference to the accompanying figures.

BRIEF DESCRIPTION OF THE DRAWINGS

FIGS. 10A through 10F are isometric views illustrating a method for producing the DFB laser shown in FIG. 9;

FIG. 26 is a cross sectional view of a DBR laser in an eleventh example;

DESCRIPTION OF THE PREFERRED EMBODIMENTS

Hereinafter, the present invention will be described by way of illustrative examples with reference to the accompanying drawings.

EXAMPLE 1

Figure 1:
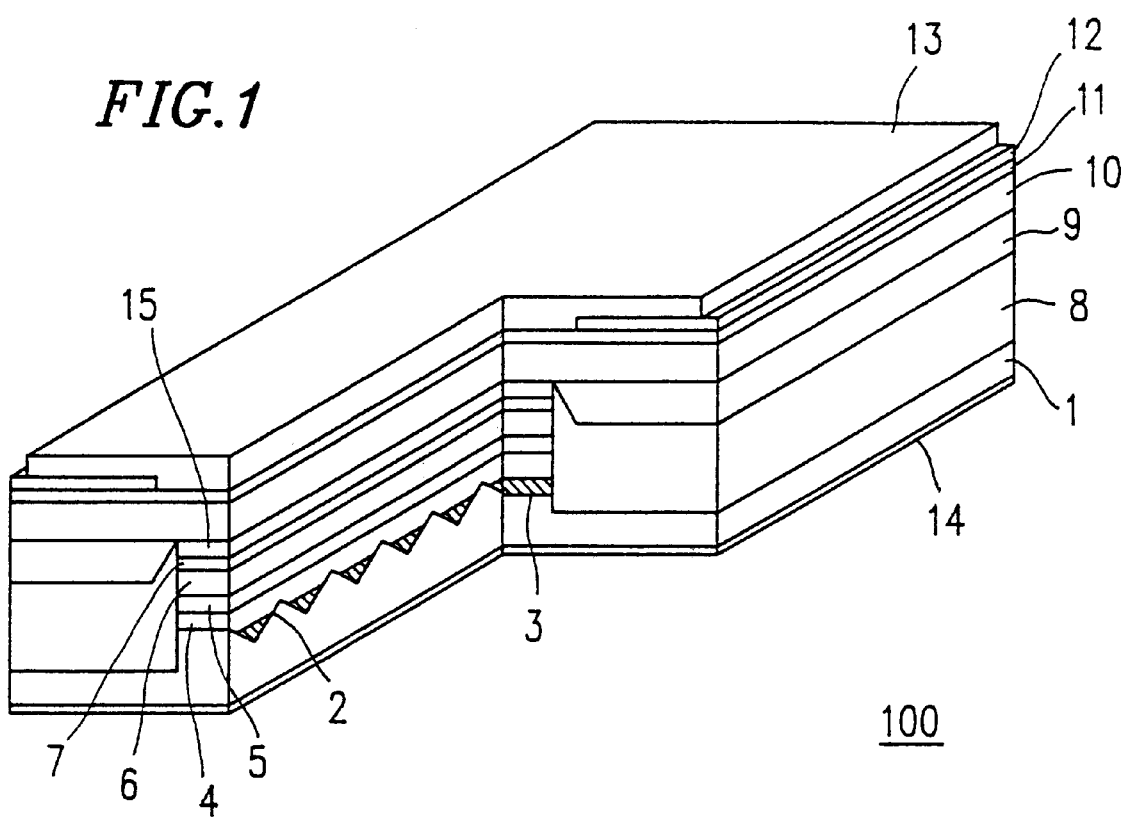
FIG. 1 is a partially cut isometric view of a DFB laser in a first example according to the present invention.

FIG. 1 is a partially cut isometric view of a DFB laser 100 in a first example according to the present invention.

The DFB laser 100 has a mesa structure on a top main surface (top surface) of an n-type InP substrate 1, the mesa structure including an n-type InP cladding layer 4 (thickness: 200 nm), an n-type InGaAsP optical waveguide layer 5 (thickness: 50 nm; bandgap wavelength λg=1.05 μm), a multiple quantum well active layer (hereinafter, referred to as a "MQW active layer") 6, a p-type InGaAsP optical waveguide layer 7 (thickness: 30 nm; λg=1.05 μm), and a p-type InP cladding layer 15 (thickness: 400 nm).

The mesa structure is provided on corrugations 2 formed at the top surface of the n-type InP substrate 1. Laterally, the mesa structure is interposed by a p-type InP current blocking layer 8 and an n-type InP current blocking layer 9 formed on the n-type InP substrate 1. On the above-mentioned semiconductor layers, a p-type InP burying layer 10 and a p-type InGaAsP contact layer 11 (λg=1.3 μm) are formed.

On a main surface of the n-type InP substrate 1 which does not have the mesa structure thereon (bottom surface), an n-type electrode 14 formed of an Au/Sn alloy is provided. On a top surface of the p-type InGaAsP contact layer 11, an insulation layer 12 formed of SiO₂ having a stripe-shaped window is formed. A p-type electrode 13 provided to substantially cover the insulation layer 12 is in contact with the p-type InGaAsP contact layer 11 through the window.

Between the n-type InP substrate 1 and the n-type InP cladding layer 4, a plurality of InAsP absorption layers 3 are arranged in the cavity length direction at a pitch of 203 nm. Each InAsP absorption layer 3 has a triangular cross section parallel to the cavity length direction and perpendicular to the main surfaces of the n-type InP substrate 1. An apex of the triangle projects into the n-type InP substrate 1. Since the InAsP absorption layer 3 has such a shape, the absorption layer is not required to be etched. It is very difficult to form an absorption layer, such as the absorption layer 3 of this example, with a small size on the order of several ten nanometers, by etching. Even when the absorption layer is formed by etching, the resulting size of the absorption layer is likely to be largely varied. Since the etching is not necessary, it is possible to easily and uniformly form an absorption layer with a small size of about several ten nanometers, thereby considerably reducing the variation of the characteristics of the respective elements.

The MQW active layer 6 includes ten quantum wells, each quantum well including an InGaAsP well layer (thickness: 6 nm) and an InGaAsP barrier layer (thickness: 10 nm; λg=1.05 μm). Strain is induced by compression into the InGaAsP well layer, and is not induced intentionally into the InGaAsP barrier layer.

The photoluminescence wavelength of the InAsP absorption layer 3 periodically formed in the cavity length direction is set to be 1.4 μm, and the oscillation wavelength from the MQW active layer 6 is set to be 1.3 μm. Due to such a structure, the InAsP absorption layer 3 causes a periodical change in the gain in the cavity length direction. Thus, laser oscillation having a single wavelength is provided at a higher possibility than the laser oscillation generated by the periodical change only in the refractive index.

A method for producing the DFB laser 100 will be described with reference to FIGS. 2A through 2E.

Figure 2D:
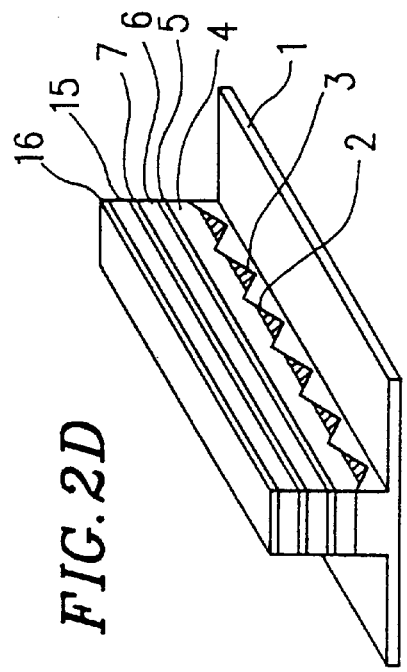
FIGS. 2A through 2E are isometric views illustrating a method for producing the DFB laser shown in FIG. 1.
Figure 2E:
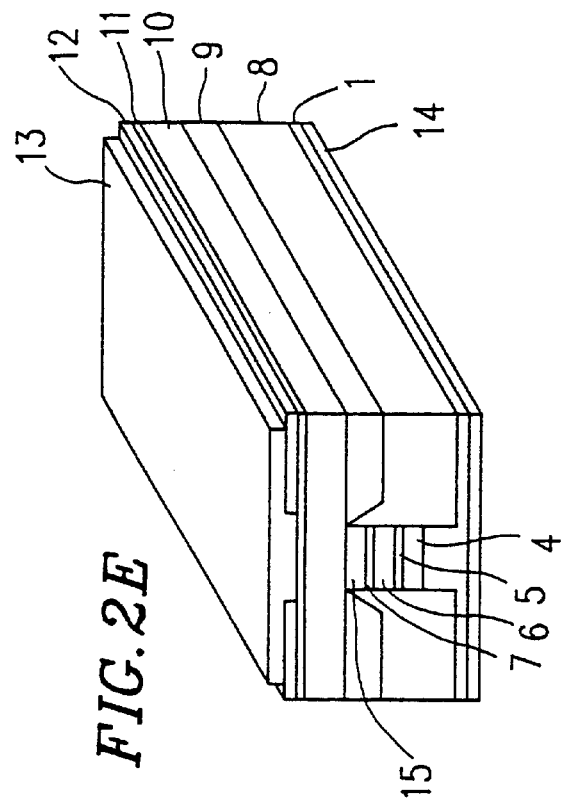
Figure 2A:
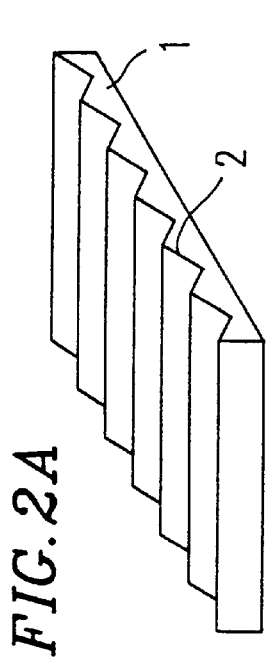

As is shown in FIG. 2A, the corrugations 2 having a pitch of 203 nm and a maximum depth of approximately 100 nm are formed at the top surface of the n-type InP substrate 1 by holographic exposure.

Figure 2B:
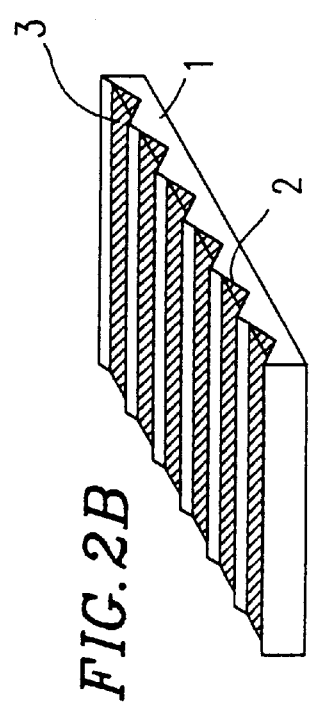
Figure 2C:
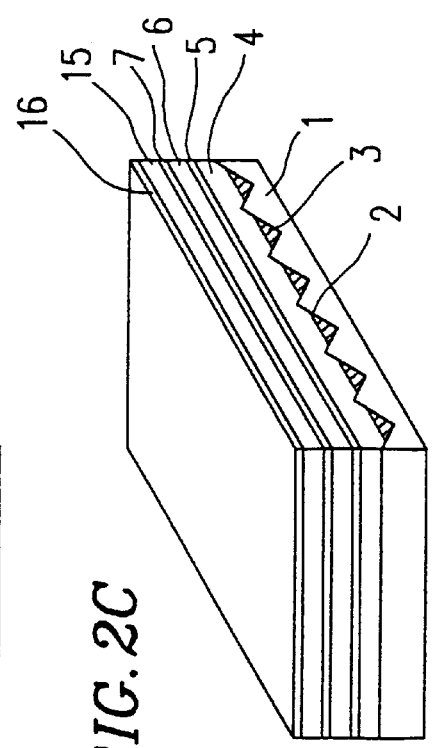

Next, a hydrogen atmosphere is mixed with 100% phosphine (PH₃) at a rate 100 cc/min. and 10% arsine (AsH₃) at a rate of 10 cc/min. In the resultant atmosphere, the n-type InP substrate 1 is heated at 600° C. As a result, as is shown in FIG. 2B, the InAsP absorption layers 3 having a thickness of approximately 50 nm are formed in a plurality of grooves of the corrugations 2 to form a diffraction grating. Then, as is shown in FIG. 2C, the n-type InP cladding layer 4, the n-type InGaAsP optical waveguide layer 5, the MQW active layer 6 having the above-described structure, the p-type InGaAsP optical waveguide layer 7, the p-type InP cladding layer 15, and a p-type InGaAsP capping layer 16 (λg=1.3 μm) are sequentially grown on the InAsP absorption layers 3 by metal organic vapor phase epitaxy (hereinafter, referred to as "MOVPE").

Thereafter, as is shown in FIG. 2D, the mesa stripe is formed by etching. Then, the p-type InP current blocking layer 8, the n-type InP current blocking layer 9, the p-type InP burying layer 10, and the p-type InGaAsP contact layer 11 are sequentially grown by liquid phase epitaxy. The insulation layer 12 formed of SiO₂ is deposited on the p-type InGaAsP contact layer 11 and a stripe-shaped window is formed. Then, the p-type electrode 13 is formed by evaporation. On the bottom surface of the n-type InP substrate 1, the n-type electrode 14 is formed by evaporation. The resultant body is cleaved to obtain the DFB laser 100 as is shown in FIG. 2E.

By the above-described method in this example, the absorption layers 3 are not formed by etching. Accordingly, even when the temperature is raised for forming the above-mentioned semiconductor layers after the mesa stripe is formed by etching, atoms are not evaporated from the surfaces of the InAsP absorption layer 3.

The DFB laser 100 in this example can also be easily produced by simply growing the semiconductor layers after the formation of the corrugations 2.

A particular step of the above-described method will be described with reference to FIGS. 3A through 3C.

Figure 3A:
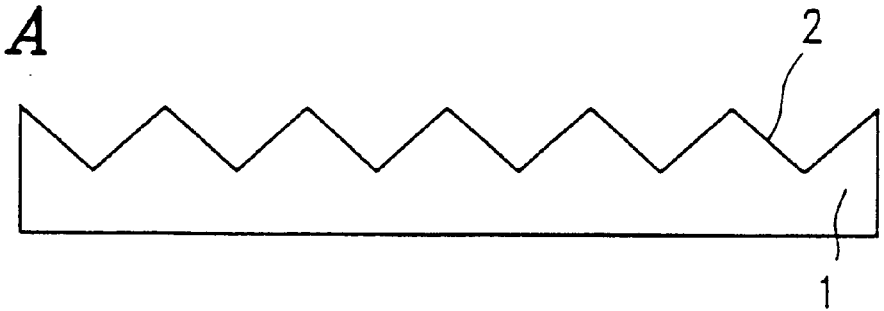
FIG. 3A through 3C are cross sectional views illustrating a specific part of the method for producing the DFB laser shown in FIG. 1.
Figure 3B:
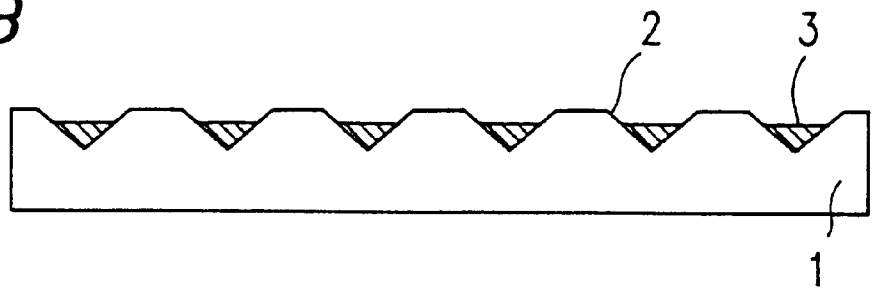
Figure 3C:
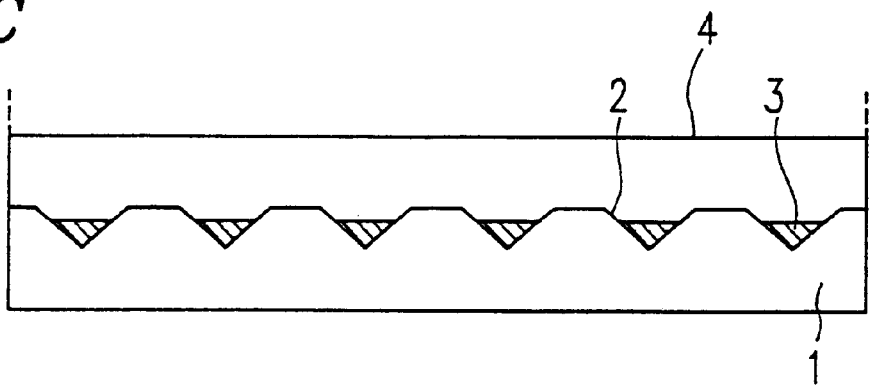

FIG. 3A is a cross sectional view of the n-type InP substrate 1 having the corrugations 2 formed by etching. By heating the n-type InP substrate 1 with the corrugations 2 in a hydrogen atmosphere mixed with phosphine (PH₃) and arsine (AsH₃), the InAsP absorption layers 3 are formed in the grooves of the corrugations 2 by mass-transport during heating, as is shown in FIG. 3B. By growing the n-type InP cladding layer 4, the InAsP absorption layers 3 having an inverted triangular cross section and arranged periodically are obtained, as shown in FIG. 3C. From the point of light absorbance, the thickness of each InAsP absorption layer 3 is preferably 10 nm or more.

Figure 4:
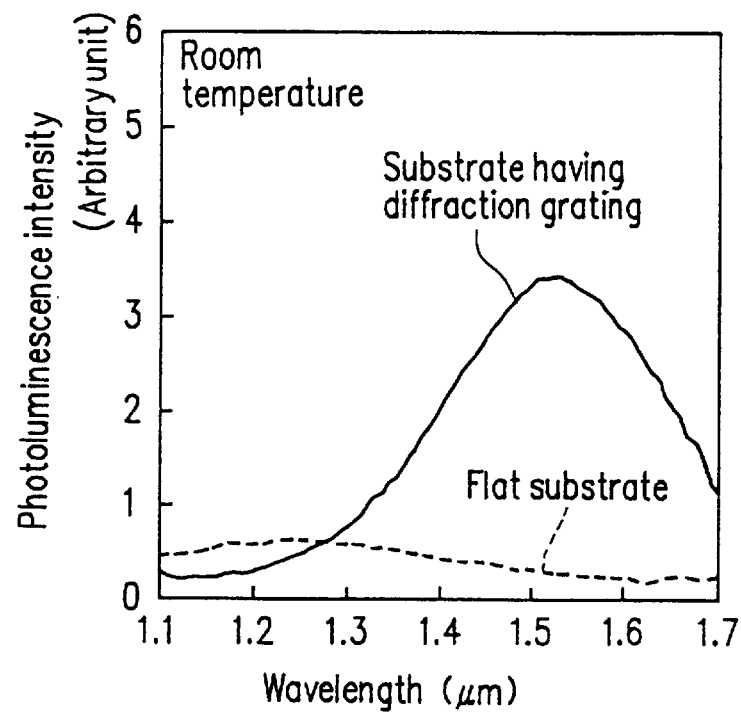
FIG. 4 is a graph illustrating a photoluminescence spectrum obtained from an InAsP layer formed in the method shown in FIGS. 2A through 2E.

FIG. 4 illustrates the photoluminescence spectrum from the InAsP absorption layer 3 produced in this manner at room temperature. A spectrum having a single peak at around 1.5 μm is observed. In the case of an InAsP absorption layer produced on the n-type InP substrate 1 without forming a diffraction grating, no emission was observed except for emission from the n-type InP substrate 1.

Figure 5:
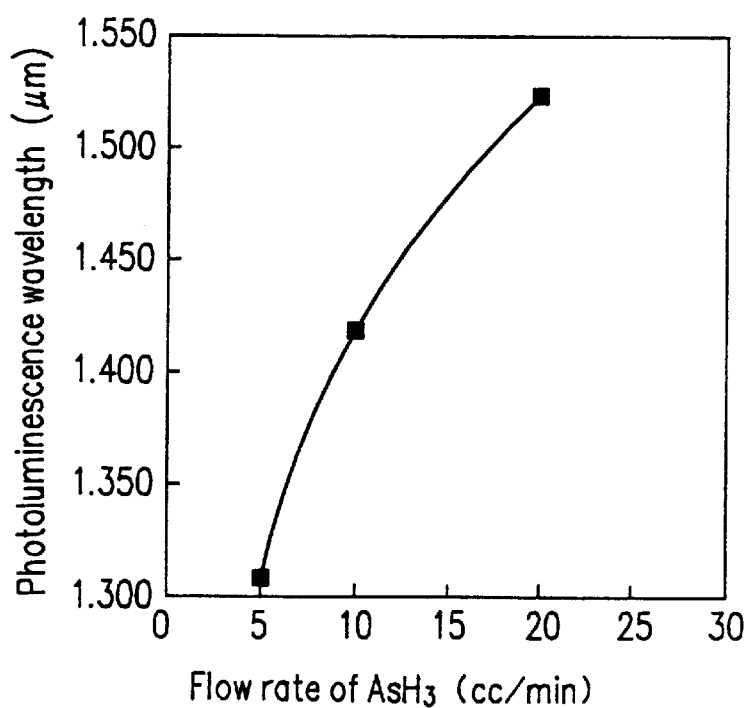
FIG. 5 is a graph illustrating how to control the bandgap energy of the InAsP layer.

FIG. 5 illustrates the photoluminescence wavelength from the InAsP absorption layer 3 with respect to the flow rate of arsine in the case where 100% phosphine is induced to the hydrogen atmosphere at a rate of 100 cc/min at 600° C. As is appreciated from FIG. 5, when the flow rate of arsine is changed while the flow rate of phosphine is kept the same, the photoluminescence wavelength from the InAsP absorption layer 3 changes continuously. Such a result indicates that the bandgap energy of the InAsP absorption layer 3 can be changed by changing the flow rate of arsine.

When the bandgap energy is set to be larger than the energy of the light emitted from an active layer after being treated with distributed feedback, namely, when the photoluminescence wavelength from an InAsP absorption layer is set to be shorter than the oscillation wavelength of the laser, the InAsP absorption layer allows the light emitted from the active layer to transmit therethrough. Since the InAsP absorption layer has a higher refractive index than InP in the vicinity thereof, the refractive index changes periodically. The DFB laser produced in this manner is of the refractive index coupled type.

When the bandgap energy is set to be smaller than the energy of the light emitted from an active layer after being treated with distributed feedback, namely, when the photoluminescence wavelength from an InAsP absorption layer is set to be longer than the oscillation wavelength of the laser, the InAsP absorption layer absorbs the light emitted from the active layer. Accordingly, the gain changes periodically. The DFB laser produced in this manner is of the gain coupled type. The DFB laser 100 in this example is of the gain coupled type.

Figure 6:
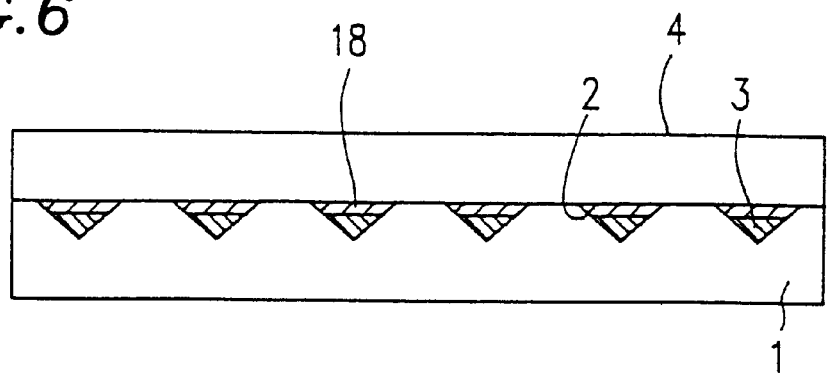
FIG. 6 is a partial cross sectional view of the DFB laser shown in FIG. 1 for describing a diffraction grating provided with InGaP refractive index compensation layers.

In the case where the periodical change in the gain is caused by growing the InAsP absorption layers 3, the periodical change in the refractive index is also caused because the refractive index of the InAsP absorption layer 3 is larger than that of InP. FIG. 6 is a cross sectional view of a structure including InGaP refractive index compensation layers 18. The InGaP refractive index compensation layers 18 each have a smaller refractive index than InP and is grown after the formation of the InAsP absorption layers 3 in the grooves of the corrugations 2. In such a structure, an average refractive index of the InAsP absorption layer 3 and the InGaP refractive index compensation layer 18 can be adjusted by the thicknesses of these two layers 3 and 18. In this manner, flexibility in designing the laser is expanded. This effect will be described in more detail in Example 3.

Figure 7:
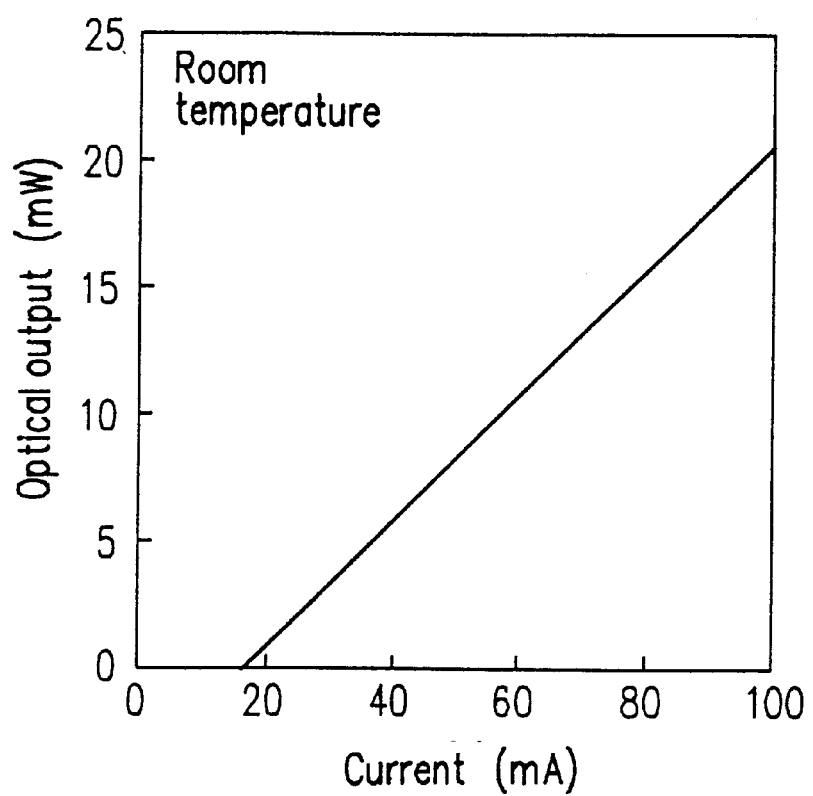
FIG. 7 is a graph illustrating the electric current vs. optical output characteristic of the DFB laser shown in FIG. 1.
Figure 8:
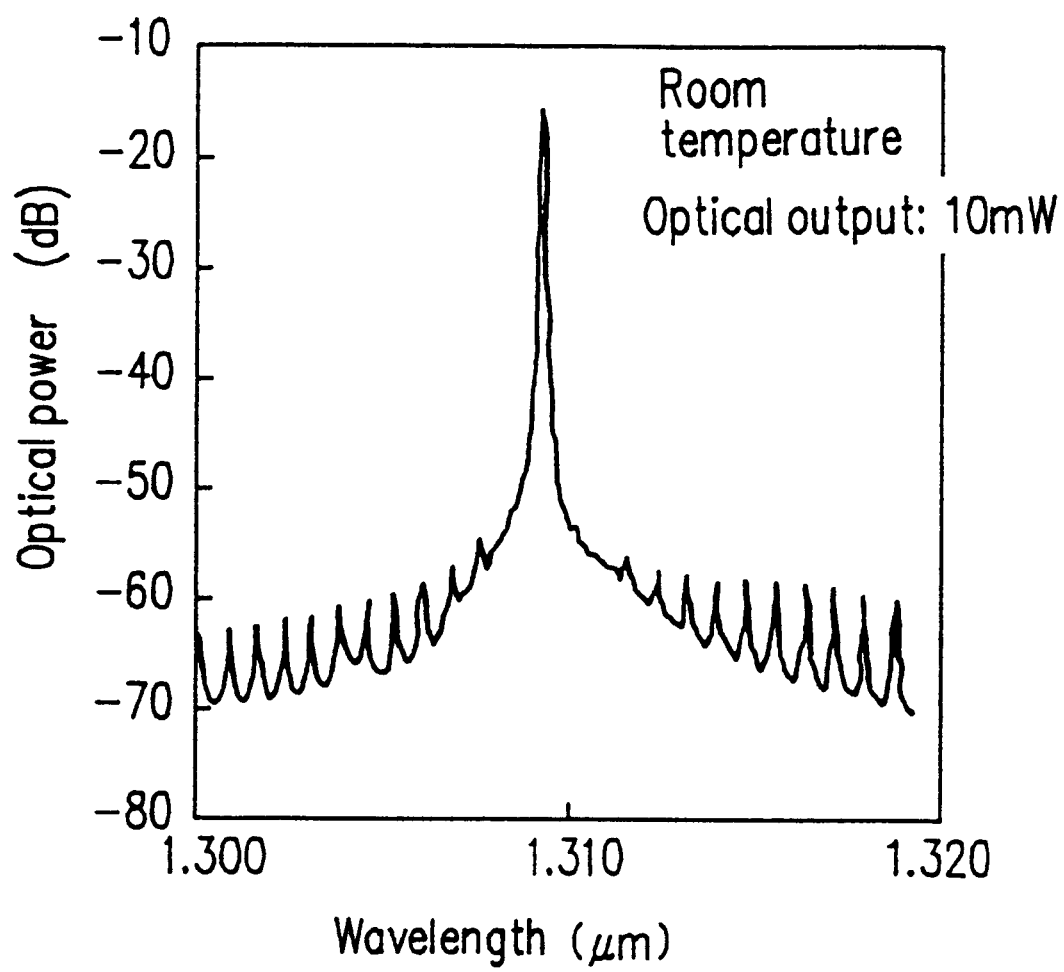
FIG. 8 is a graph illustrating a spectral characteristic of the DFB laser shown in FIG. 1.

FIG. 7 illustrates the optical output vs. current characteristic in the DFB laser 100. The characteristic is excellent with the threshold current of 16 mA and the slope efficiency of 0.25 mW/mA. FIG. 8 illustrates the oscillation spectrum of the DFB laser 100. The side mode restriction ratio, which indicates the ratio of the main oscillation mode with respect to the side oscillation mode, is 40 dB or more, which signifies that stable laser oscillation having a single wavelength is obtained. Considering that the side mode restriction ratio of a general DFB laser of the refractive index coupled type is approximately 30 dB, the DFB laser 100 has an advantage of being the gain coupled type.

The n-type InP cladding layer 4 can be replaced with an n-type InGaAsP waveguide layer to be integral with the n-type InGaAsP optical waveguide layer 5.

The DFB laser 100, which is of the gain coupled type, generates laser oscillation having a single wavelength and is stable against the light returned from outside the DFB laser 100.

EXAMPLE 2

Figure 9:
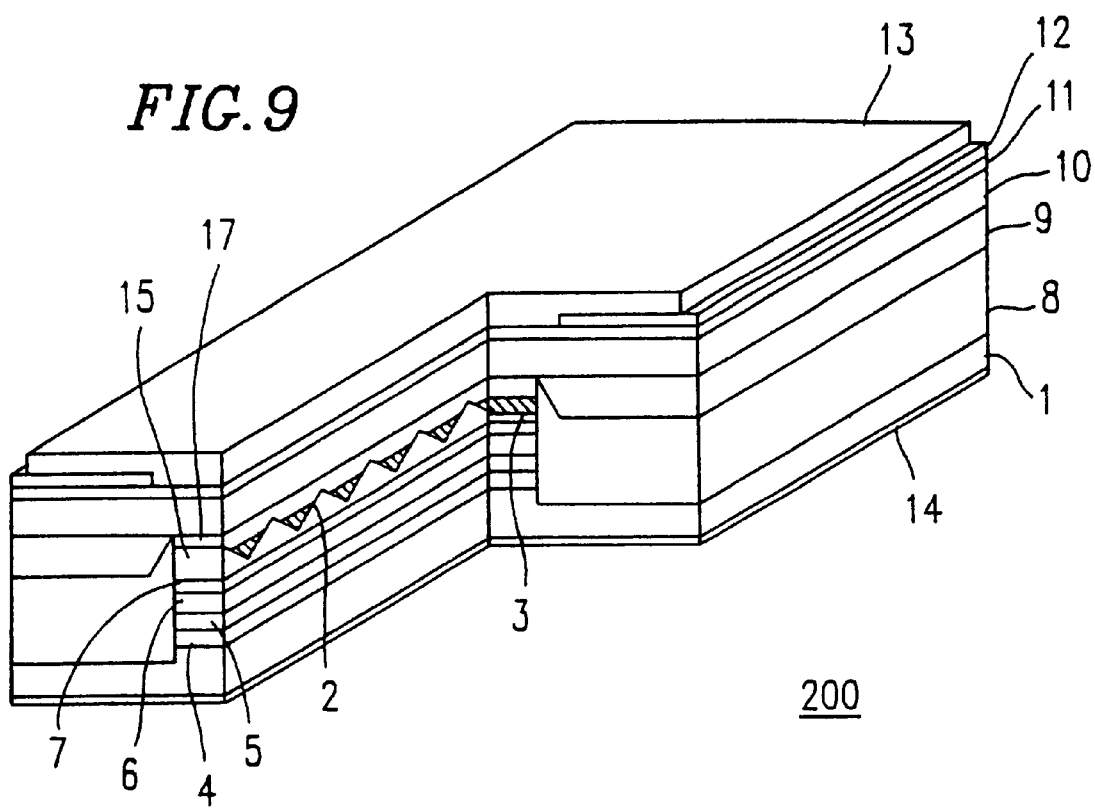
FIG. 9 is a partially cut isometric view of a DFB laser in a second example according to the present invention.

FIG. 9 is a partially cut isometric view of a DFB laser 200 in a second example according to the present invention. Identical elements as those in the first example will bear identical reference numerals therewith and a description thereof will be omitted.

The DFB laser 200 has a mesa structure on a top main surface of an n-type InP substrate 1, the mesa structure including an n-type InP cladding layer 4 (thickness: 200 nm), an n-type InGaAsP optical waveguide layer 5 (thickness: 50 nm; λg=1.05 μm), an MQW active layer 6, a p-type InGaAsP optical waveguide layer 7 (thickness: 30 nm; λg=1.05 μm), a first p-type InP cladding layer 15 (average thickness: 100 nm), and a second p-type InP cladding layer 17 (average thickness: 300 nm). The mesa structure is provided on the top surface of the n-type InP substrate 1. Laterally, the mesa structure is interposed by a p-type InP current blocking layer 8 and an n-type InP current blocking layer 9 formed on the n-type InP substrate 1. On the above-mentioned semiconductor layers, a p-type InP burying layer 10 and a p-type InGaAsP contact layer 11 (λg=1.3 μm) are formed.

On a main surface of the n-type InP substrate 1 which does not have the mesa structure thereon (bottom surface), an n-type electrode 14 formed of an Au/Sn alloy is provided. On a top surface of the p-type InGaAsP contact layer 11, an insulation layer 12 formed of $SiO_2$ having a stripe-shaped window is formed. A p-type electrode 13 provided to substantially cover the insulation layer 12 is in contact with the p-type InGaAsP contact layer 11 through the window.

Between the first p-type InP cladding layer 15 and the second p-type InP cladding layer 17, a plurality of InAsP absorption layers 3 are arranged in the cavity length direction at a pitch of 203 nm. Each InAsP absorption layer 3 has a triangular cross section parallel to the cavity length direction and perpendicular to the main surfaces of the n-type InP substrate 1, and an apex of the triangle projects into the n-type InP substrate 1.

The MQW active layer 6 includes ten quantum wells, each quantum well including an InGaAsP well layer (thickness: 6 nm) and an InGaAsP barrier layer (thickness: 10 nm; λg=1.05 μm). Strain is induced by compression into the InGaAsP well layer, and is not induced intentionally into the InGaAsP barrier layer.

The photoluminescence wavelength of the InAsP absorption layer 3 periodically formed in the cavity length direction is set to be 1.4 μm, and the oscillation wavelength from the MQW active layer 6 is set to be 1.3 μm. Due to such a structure, the InAsP absorption layer 3 causes a periodical change in the gain in the cavity length direction. Thus, laser oscillation having a single wavelength is provided at a higher possibility than the laser oscillation generated by the periodical change only in the refractive index for the reasons described above.

In this example, the InAsP absorption layers 3 are formed above the MQW active layer 6. In the structure of the first example, the n-type InP cladding layer 4 and the n-type InGaAsP optical waveguide layer 5 interposed between the InAsP absorption layers 3 and the MQW active layer 6 each preferably have a relatively large thickness in order to recover the crystallinity. In the structure in the second example, the thickness of each of the p-type InGaAsP optical waveguide layer 7 and the first p-type InP cladding layer 15 interposed between the MQW active layer 6 and the InAsP absorption layers 3 can be set relatively freely. This indicates that the optical intensity distribution and the degree of coupling due to the InAsP absorption layer 3 can be set more freely than in the first example.

Figure 9A:
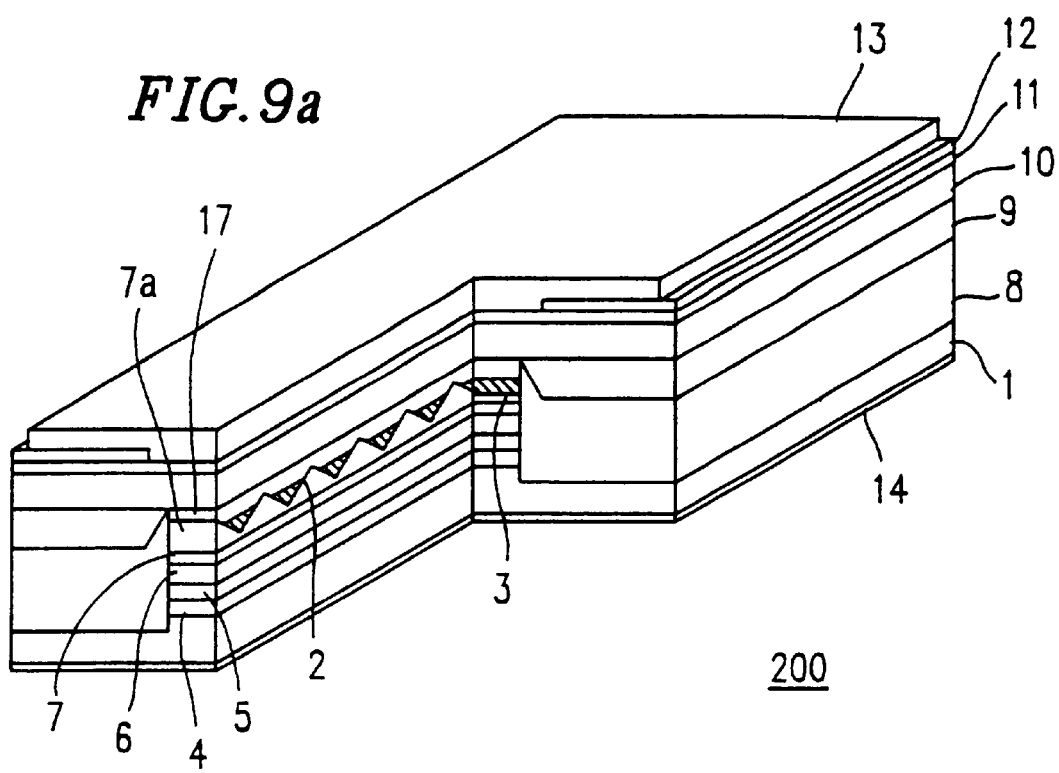
FIG. 9A is a partially cut isometric view of a DFB laser as shown in FIG. 9, but with the cladding layer replaced with an optical waveguide layer.

As shown in FIG. 9A, the first p-type InP cladding layer 15 of FIG. 9 can be replaced with a p-type InGaAsP optical waveguide layer 7a to be integral with the p-type InGaAsP optical waveguide layer 7.

A method for producing the DFB laser 200 will be described with reference to FIGS. 10A through 10F.

As is shown in FIG. 10A, the n-type InP cladding layer 4, the n-type InGaAsP optical waveguide layer 5, the MQW active layer 6 having the above-described structure, and the p-type InGaAsP optical waveguide layer 7, the first p-type InP cladding layer 15 are sequentially grown on the n-type InP substrate 1 by MOVPE. Then, as is shown in FIG. 10B, corrugations 2 are formed having a pitch of 203 nm and a maximum depth of approximately 100 nm is formed by holographic exposure.

Next, a hydrogen atmosphere is mixed with 100% phosphine ($PH_3$) at a rate 100 cc/min. and 10% arsine ($AsH_3$) at a rate of 10 cc/min. In the resultant atmosphere, the n-type InP substrate 1 is heated at 600° C. As a result, as is shown in FIG. 10C, the InAsP absorption layers 3 having a thickness of approximately 50 nm are formed in the grooves of the corrugations 2 to form a diffraction grating. Then, as is shown in FIG. 10D, the second p-type InP cladding layer 17 (thickness: 300 nm) and a p-type InGaAsP capping layer 16 ($\lambda g=1.3$ $\mu m$) are sequentially formed on the InAsP absorption layers 3.

Thereafter, as is shown in FIG. 10E, the mesa stripe is formed by etching. Then, the p-type InP current blocking layer 8, the n-type InP current blocking layer 9, the p-type InP burying layer 10, and the p-type InGaAsP contact layer 11 are sequentially grown by liquid phase epitaxy. The insulation layer 12 formed of $SiO_2$ is deposited on the p-type InGaAsP contact layer 11 and a stripe-shaped window is formed. Then, the p-type electrode 13 is formed by evaporation. On the bottom surface of the n-type InP substrate 1, the n-type electrode 14 is formed by evaporation. The resultant body is cleaved to obtain the DFB laser 200 as is shown in FIG. 10F.

EXAMPLE 3

Figure 11:
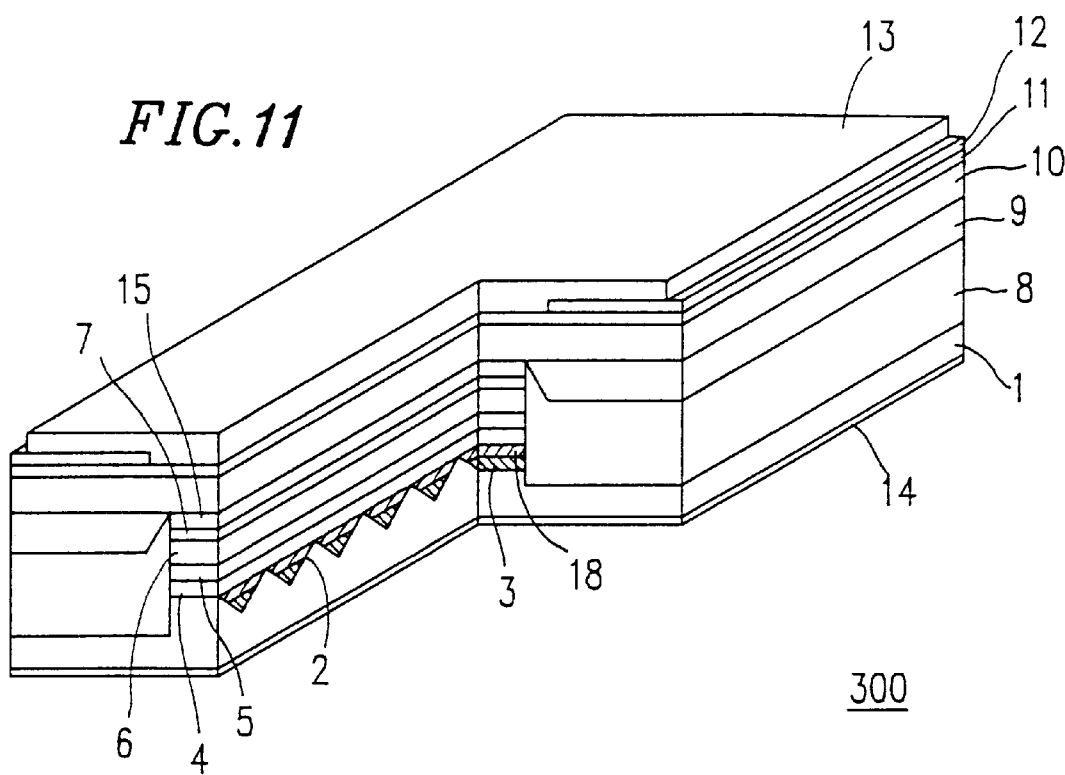
FIG. 11 is a partially cut isometric view of a DFB laser in a third example according to the present invention.

FIG. 11 is a partially cut isometric view of a DFB laser 300 in a third example according to the present invention. Identical elements as those in the first example will bear identical reference numerals therewith and a description thereof will be omitted.

The DFB laser 300 has a mesa structure on a top main surface of an n-type InP substrate 1, the mesa structure including an n-type InP cladding layer 4 (thickness: 200 nm), an n-type InGaAsP optical waveguide layer 5 (thickness: 50 nm; $\lambda g=1.05$ $\mu m$), an MQW active layer 6, a p-type InGaAsP optical waveguide layer 7 (thickness: 30 nm; $\lambda g=1.05$ $\mu m$), and a p-type InP cladding layer 15 (thickness: 400 nm). The mesa structure is provided on corrugations 2 formed at the top surface of the n-type InP substrate 1. Laterally, the mesa structure is interposed by a p-type InP current blocking layer 8 and an n-type InP current blocking layer 9 formed on the n-type InP substrate 1. On the above-mentioned semiconductor layers, a p-type InP burying layer 10 and a p-type InGaAsP contact layer 11 ($\lambda g=1.3$ $\mu m$) are formed.

On a main surface of the n-type InP substrate 1 which does not have the mesa structure thereon (bottom surface), an n-type electrode 14 formed of an Au/Sn alloy is provided. On a top surface of the p-type InGaAsP contact layer 11, an insulation layer 12 formed of $SiO_2$ having a stripe-shaped window is formed. A p-type electrode 13 provided to substantially cover the insulation layer 12 is in contact with the p-type InGaAsP contact layer 11 through the window.

Between the n-type InP substrate 1 and the n-type InP cladding layer 4, a plurality of InAsP absorption layers 3 and a plurality of InGaP refractive index compensation layers 18 are arranged in the cavity length direction at a pitch of 203 nm. Each InAsP absorption layer 3 and the InGaP refractive index compensation layer 18 formed thereon have a triangular cross section parallel to the cavity length direction and perpendicular to the main surfaces of the n-type InP substrate 1, and an apex of the triangle projects into the n-type InP substrate 1. The average refractive index of the InAsP absorption layers 3 and the InGaP refractive index compensation layers 18 is equal to the refractive index of InP.

The MQW active layer 6 includes ten quantum wells, each quantum well including an InGaAsP well layer (thickness: 6 nm) and an InGaAsP barrier layer (thickness: 10 nm; $\lambda g=1.05$ $\mu m$). Strain is induced by compression into the InGaAsP well layer, and is not induced intentionally into the InGaAsP barrier layer.

The photoluminescence wavelength of the InAsP absorption layer 3 periodically formed in the cavity length direction is set to be 1.4 $\mu m$, and the oscillation wavelength from the MQW active layer 6 is set to be 1.3 $\mu m$. Due to such a structure, the InAsP absorption layer 3 causes a periodical change in the gain in the cavity length direction. Further, since the average refractive index of the InAsP absorption layer 3 and the InGaP refractive index compensation layers 18 is equal to the refractive index of InP owing to the provision of the InGaP refractive index compensation layers 18, the refractive index does not change periodically. Only the gain changes periodically. Thus, for the above-described reasons, laser oscillation having a single wavelength is provided at a higher possibility than the laser oscillation generated by the periodical change both in the refractive index and the gain.

The n-type InP cladding layer 4 can be replaced with an n-type InGaAsP optical waveguide layer to be integral with the p-type InGaAsP optical waveguide layer 7.

A method for producing the DFB laser 300 will be described with reference to FIGS. 12A through 12F.

Figure 12A:
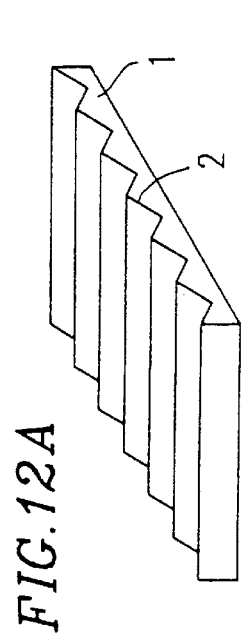
FIGS. 12A through 12F are isometric views illustrating a method for producing the DFB laser shown in FIG. 11.

As is shown in FIG. 12A, corrugations 2 having a pitch of 203 nm and a maximum depth of approximately 100 nm are formed at the top surface of the n-type InP substrate 1 by holographic exposure.

Figure 12B:
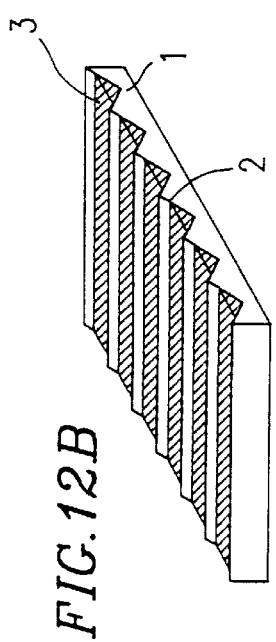
Figure 12C:
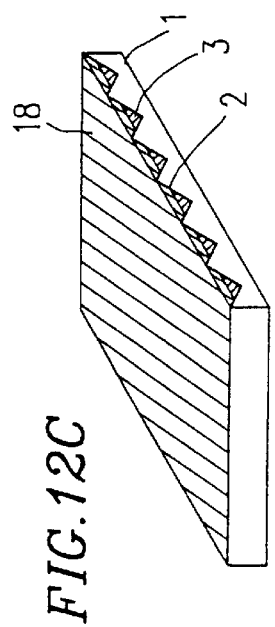
Figure 12D:
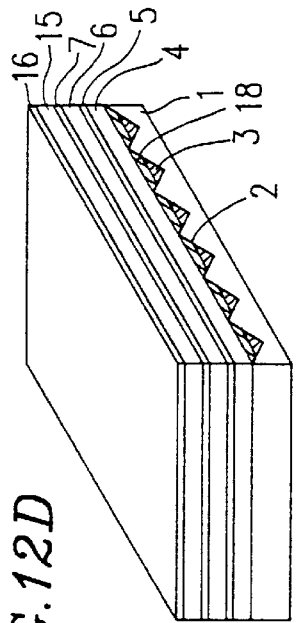

Next, a hydrogen atmosphere is mixed with 100% phosphine ($PH_3$) at a rate 100 cc/min. and 10% arsine ($AsH_3$) at a rate of 10 cc/min. In the resultant atmosphere, the n-type InP substrate 1 is heated at 600° C. As a result, as is shown in FIG. 12B, the InAsP absorption layers 3 having a thickness of approximately 50 nm are formed in the grooves of the corrugations 2. Then, as is shown in FIG. 12C, the InGaP refractive index compensation layers 18 are grown thereon by MOVPE to form a diffraction grating. Thereafter, as is shown in FIG. 12D, the n-type InP cladding layer 4, the n-type InGaAsP optical waveguide layer 5, the MQW active layer 6 having the above-described structure, and the p-type InGaAsP optical waveguide layer 7, the p-type InP cladding layer 15 and a p-type InGaAsP capping layer 16 ($\lambda g=1.3$ $\mu m$) are sequentially grown on the InGaP refractive index compensation layers 18.

Figure 12E:
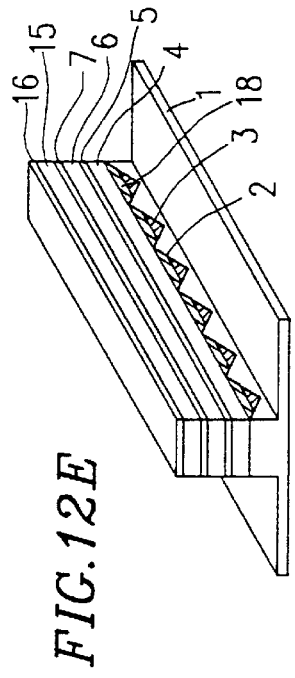
Figure 12F:
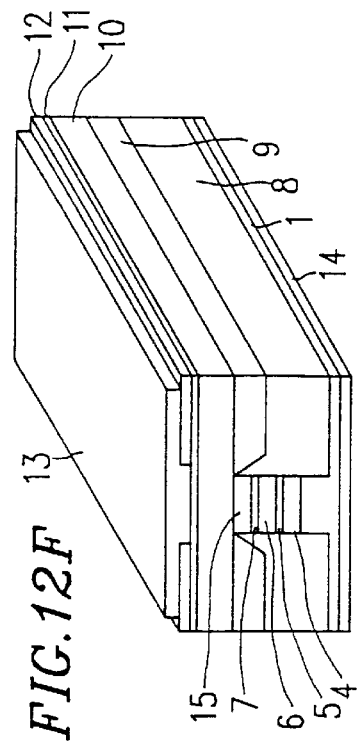

Then, as is shown in FIG. 12E, the mesa stripe is formed by etching. The p-type InP current blocking layer 8, the n-type InP current blocking layer 9, the p-type InP burying layer 10, and the p-type InGaAsP contact layer 11 (λg=1.3 μm) are sequentially grown by liquid phase epitaxy. The insulation layer 12 formed of SiO₂ is deposited on the p-type InGaAsP contact layer 11 and a stripe-shaped window is formed. Then, the p-type electrode 13 is formed by evaporation. On the bottom surface of the n-type InP substrate 1, the n-type electrode 14 is formed by evaporation. The resultant body is cleaved to obtain the DFB laser 300 as is shown in FIG. 12F.

EXAMPLE 4

Figure 13:
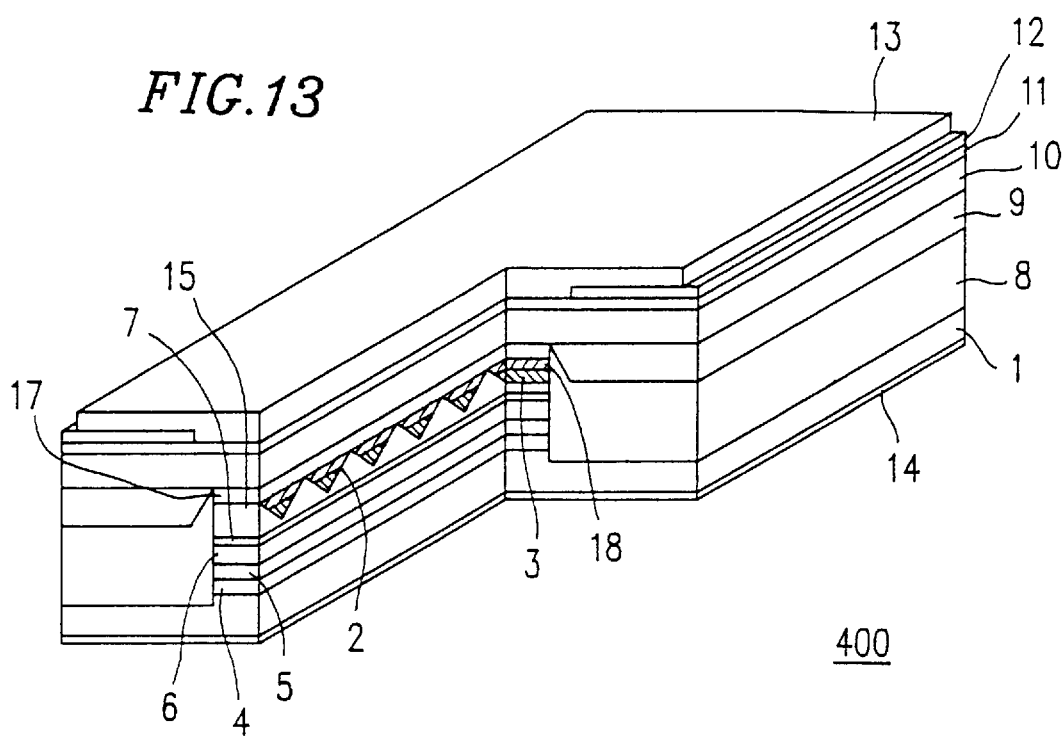
FIG. 13 is a partially cut isometric view of a DFB laser in a fourth example according to the present invention.

FIG. 13 is a partially cut isometric view of a DFB laser 400 in a fourth example according to the present invention. Identical elements as those in the first example will bear identical reference numerals therewith and a description thereof will be omitted.

The DFB laser 400 has a mesa structure on a top main surface of an n-type InP substrate 1, the mesa structure including an n-type InP cladding layer 4 (thickness: 200 nm), an n-type InGaAsP optical waveguide layer 5 (thickness: 50 nm; λg=1.05 μm), an MQW active layer 6, a p-type InGaAsP optical waveguide layer 7 (thickness: 30 nm; λg=1.05 μm), a first p-type InP cladding layer 15 (average thickness: 100 nm), and a second p-type InP cladding layer 17 (average thickness: 300 nm). The mesa structure is provided on the top surface of the n-type InP substrate 1. Laterally, the mesa structure is interposed by a p-type InP current blocking layer 8 and an n-type InP current blocking layer 9 formed on the n-type InP substrate 1. On the above-mentioned semiconductor layers, a p-type InP burying layer 10 and a p-type InGaAsP contact layer 11 (λg=1.3 μm) are formed.

On a main surface of the n-type InP substrate 1 which does not have the mesa structure thereon (bottom surface), an n-type electrode 14 formed of an Au/Sn alloy is provided. On a top surface of the p-type InGaAsP contact layer 11, an insulation layer 12 formed of SiO₂ having a stripe-shaped window is formed. A p-type electrode 13 provided to substantially cover the insulation layer 12 is in contact with the p-type InGaAsP contact layer 11 through the window.

Between the first p-type InP cladding layer 15 and the second p-type InP cladding layer 17, a plurality of InAsP absorption layers 3 and a plurality of InGaP refractive index compensation layers 18 are arranged in the cavity length direction at a pitch of 203 nm. Each InAsP absorption layer 3 and the InGaP refractive index compensation layer 18 formed thereon have a triangular cross section parallel to the cavity length direction and perpendicular to the main surfaces of the n-type InP substrate 1, and an apex of the triangle projects into the n-type InP substrate 1.

The MQW active layer 6 includes ten quantum wells, each quantum well including an InGaAsP well layer (thickness: 6 nm) and an InGaAsP barrier layer (thickness: 10 nm; λg=1.05 μm). Strain is induced by compression into the InGaAsP well layer, and is not induced intentionally into the InGaAsP barrier layer.

The photoluminescence wavelength of the InAsP absorption layer 3 periodically formed in the cavity length direction is set to be 1.4 μm, and the oscillation wavelength from the MQW active layer 6 is set to be 1.3 μm. Due to such a structure, the InAsP absorption layer 3 causes a periodical change in the gain in the cavity length direction. Further, since the average refractive index of the InAsP absorption layer 3 and the InGaP refractive index compensation layers 18 is equal to the refractive index of InP owing to the provision of the InGaP refractive index compensation layers 18, the refractive index does not change periodically. Only the gain changes periodically. Thus, for the above-described reasons, laser oscillation having a single wavelength is provided at a higher possibility than the laser oscillation generated by the periodical change both in the refractive index and the gain.

In this example, the InAsP absorption layers 3 are formed above the MQW active layer 6. In the structure of the third example, the n-type InP cladding layer 4 and the n-type InGaAsP optical waveguide layer 5 interposed between the InAsP absorption layers 3 and the MQW active layer 6 each preferably have a relatively large thickness in order to recover the crystallinity. In the structure in the fourth example, the thickness of each of the p-type InGaAsP optical waveguide layer 7 and the first p-type InP cladding layer 15 interposed between the MQW active layer 6 and the InAsP absorption layers 3 can be set relatively freely. This indicates that the optical intensity distribution and the degree of coupling due to the InAsP absorption layer 3 can be set more freely than in the third example.

The first p-type InP cladding layer 15 can be replaced with a p-type InGaAsP optical waveguide layer to be integral with the p-type InGaAsP optical waveguide layer 7.

A method for producing the DFB laser 400 will be described with reference to FIGS. 14A through 14F.

Figure 14A:
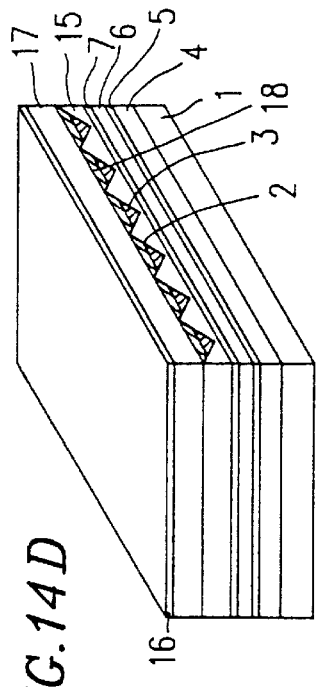
FIGS. 14A through 14F are isometric views illustrating a method for producing the DFB laser shown in FIG. 13.

As is shown in FIG. 14A, the n-type InP cladding layer 4, the n-type InGaAsP optical waveguide layer 5, the MQW active layer 6 having the above-described structure, and the p-type InGaAsP optical waveguide layer 7, the first p-type InP cladding layer 15 are sequentially grown on the n-type InP substrate 1 by MOVPE. Then, corrugations 2 are formed having a pitch of 203 nm and a maximum depth of approximately 100 nm are formed by holographic exposure.

Figure 14B:
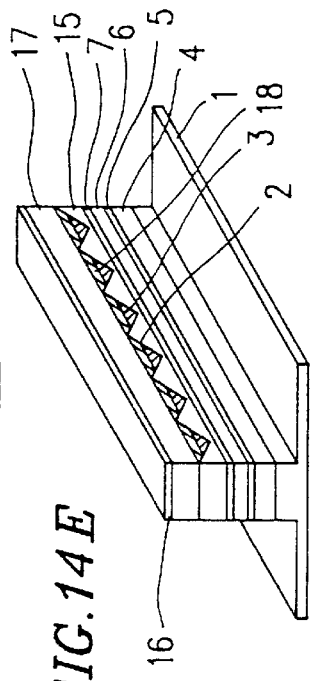
Figure 14C:
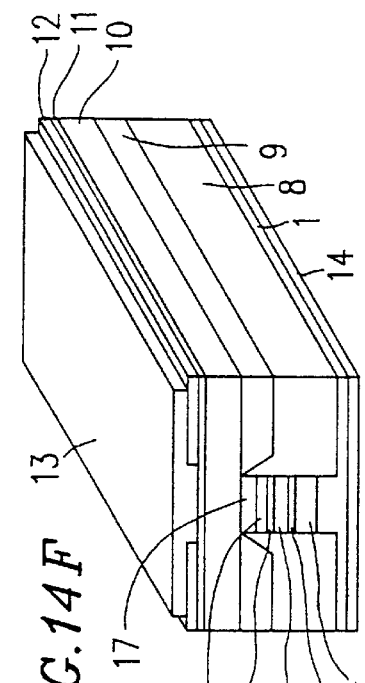
Figure 14D:
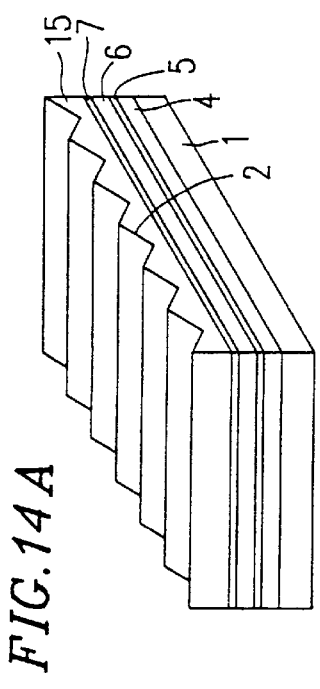

Next, a hydrogen atmosphere is mixed with 100% phosphine (PH₃) at a rate 100 cc/min. and 10% arsine (AsH₃) at a rate of 10 cc/min. In the resultant atmosphere, the n-type InP substrate 1 is heated at 600° C. As a result, as is shown in FIG. 14B, the InAsP absorption layers 3 having a thickness of approximately 50 nm are formed in the grooves of the corrugations 2. Then, as is shown in FIG. 14C, the InGaP refractive index compensation layers 18 are grown thereon by MOVPE to form a diffraction grating. As is shown in FIG. 14D, the second p-type InP cladding layer 17 and a p-type InGaAsP capping layer 16 (λg=1.3 μm) are sequentially formed on InGaP refractive index compensation layers 18.

Figure 14E:
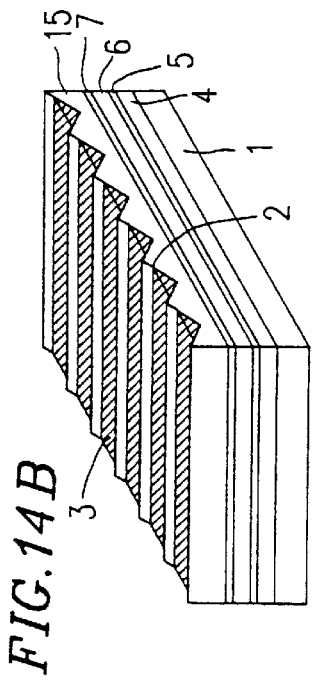
Figure 14F:
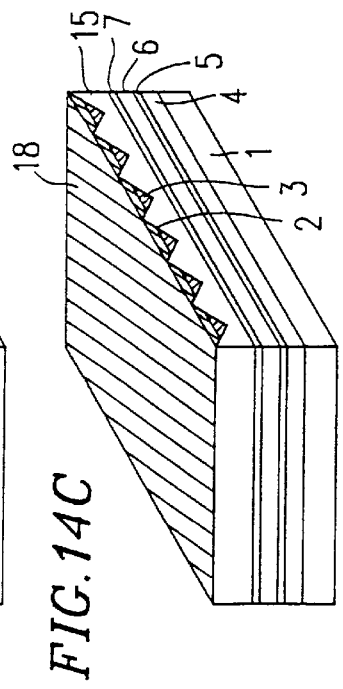

Thereafter, as is shown in FIG. 14E, the mesa stripe is formed by etching. Then, the p-type InP current blocking layer 8, the n-type InP current blocking layer 9, the p-type InP burying layer 10, and the p-type InGaAsP contact layer 11 (λg=1.3 μm) are sequentially grown by liquid phase epitaxy. The insulation layer 12 formed of SiO₂ is deposited on the p-type InGaAsP contact layer 11 and a stripe-shaped window is formed. Then, the p-type electrode 13 is formed by evaporation. On the bottom surface of the n-type InP substrate 1, the n-type electrode 14 is formed by evaporation. The resultant body is cleaved to obtain the DFB laser 400 as is shown in FIG. 14F.

The DFB lasers described in the first through fourth examples generate laser oscillation at 1.3 μm and the vicinity thereof. The present invention is applicable to DFB lasers designed for other wavelength ranges, such as 1.55 μm and the vicinity thereof.

The DFB lasers described in the first through fourth examples have a buried structure. The same effects can be obtained in a DFB laser having a ridge structure.

In the first through fourth examples, the buried structure is formed by liquid phase epitaxy, but it can also be formed by MOVPE.

EXAMPLE 5

Figure 15:
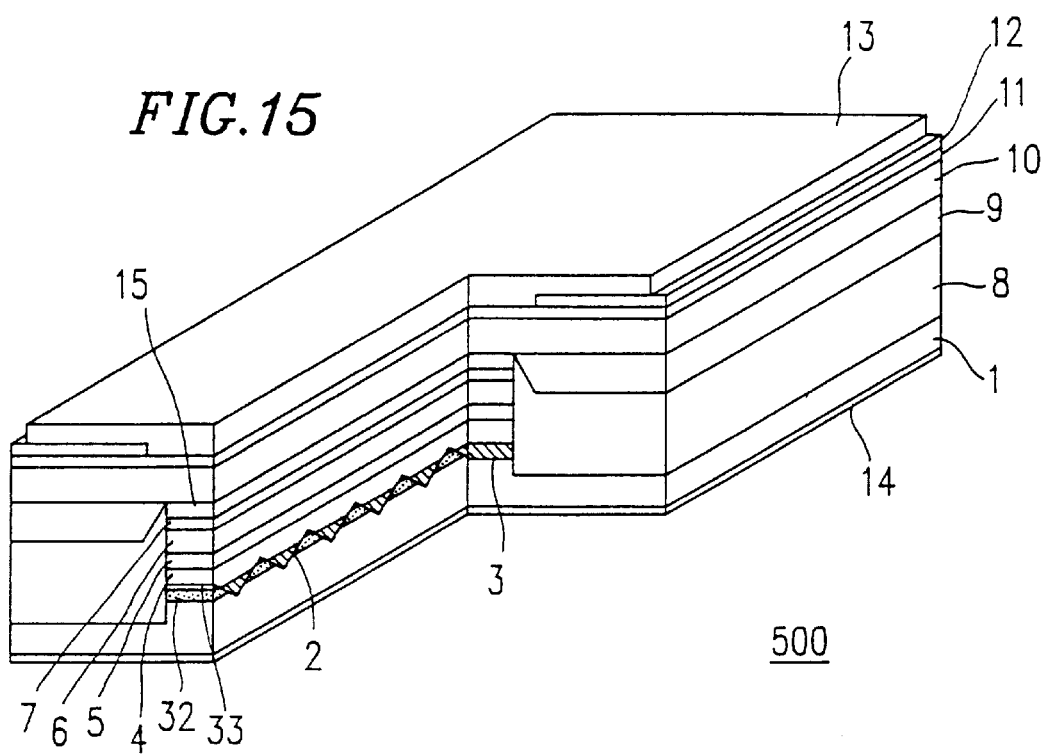
FIG. 15 is a partially cut isometric view of a DFB laser in a fifth example according to the present invention.

FIG. 15 is a partially cut isometric view of a DFB laser 500 in a third example according to the present invention. Identical elements as those in the first example will bear identical reference numerals therewith and a description thereof will be omitted.

The DFB laser 500 has a mesa structure on a top main surface of an n-type InP substrate 1, the mesa structure including an n-type InP cladding layer 4 (thickness: 200 nm), an n-type InGaAsP optical waveguide layer 5 (thickness: 50 nm; $\lambda g=1.05$ $\mu$m), an MQW active layer 6, a p-type InGaAsP optical waveguide layer 7 (thickness: 30 nm; $\lambda g=1.05$ $\mu$m), and a p-type InP cladding layer 15 (thickness: 400 nm). The mesa structure is provided on corrugations 2 formed at the top surface of the n-type InP substrate 1. Laterally, the mesa structure is interposed by a p-type InP current blocking layer 8 and an n-type InP current blocking layer 9 formed on the n-type InP substrate 1. On the above-mentioned semiconductor layers, a p-type InP burying layer 10 and a p-type InGaAsP contact layer 11 ($\lambda g=1.3$ $\mu$m) are formed.

On a main surface of the n-type InP substrate 1 which does not have the mesa structure thereon (bottom surface), an n-type electrode 14 formed of an Au/Sn alloy is provided. On a top surface of the p-type InGaAsP contact layer 11, an insulation layer 12 formed of $SiO_2$ having a stripe-shaped window is formed. A p-type electrode 13 provided to substantially cover the insulation layer 12 is in contact with the p-type InGaAsP contact layer 11 through the window.

The InAsP absorption layers 3 are each interposed between n-type InGaAsP refractive index compensation layers 32 (thickness: 50 nm; $\lambda g$: 1.2 $\mu$m).

The MQW active layer 6 includes ten quantum wells, each quantum well including an InGaAsP well layer (thickness: 6 nm) and an InGaAsP barrier layer (thickness: 10 nm; $\lambda g=1.05$ $\mu$m). Strain is induced by compression into the InGaAsP well layer, and is not induced intentionally into the InGaAsP barrier layer.

The photoluminescence wavelength of the InAsP absorption layer 3 periodically formed in the cavity length direction is set to be 1.4 $\mu$m, and the oscillation wavelength from the MQW active layer 6 is set to be 1.3 $\mu$m. Due to such a structure, the InAsP absorption layer 3 causes a periodical change in the gain in the cavity length direction. Further, the n-type InGaAsP refractive index compensation layers 32 interposing the InAsP absorption layers 3 significantly reduce the periodical change in the refractive index. Accordingly, substantially only the gain changes periodically. Thus, for the above-described reasons, laser oscillation having a single wavelength is provided at a higher possibility than the laser oscillation generated by the periodical change both in the refractive index and the gain.

The n-type InP cladding layer 4 can be replaced with an n-type InGaAsP optical waveguide layer to be integral with the p-type InGaAsP optical waveguide layer 7.

The InAsP absorption layers 3 and the n-type InGaAsP refractive index compensation layers 32 can be formed in the p-type InP cladding layer 15.

A method for producing the DFB laser 500 will be described with reference to FIGS. 16A through 16F and 17A through 17D.

Figure 16A:
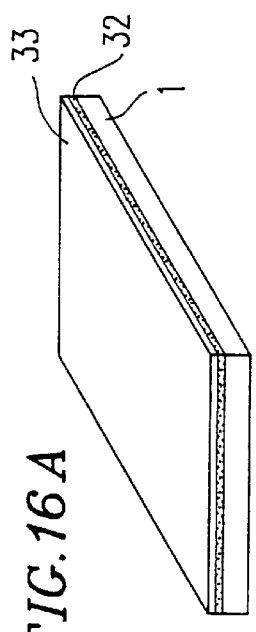
FIGS. 16A through 16F are isometric views illustrating a method for producing the DFB laser shown in FIG. 15.
Figure 16B:
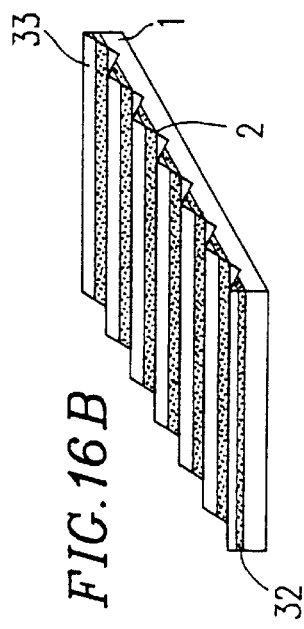
Figure 17A:
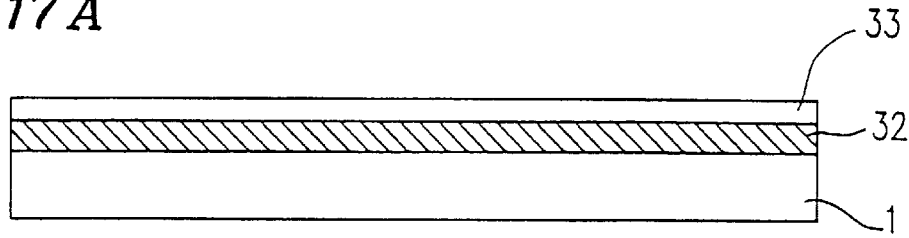
FIGS. 17A through 17D are cross sectional views of the DFB laser shown in FIG. 15 for describing a diffraction grating provided with InAsP refractive index compensation layers.
Figure 17B:
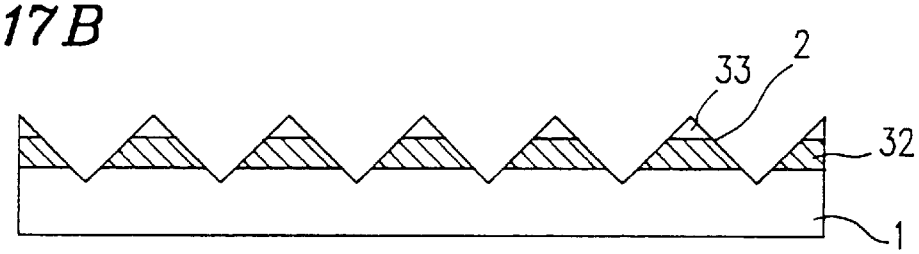

As is shown in FIGS. 16A and 17A, an n-type InGaAsP layer and n-type InP layer (thickness: 20 nm) are sequentially grown on the n-type InP substrate 1 by MOVPE. As is shown in FIGS. 16B and 17B, corrugations 2 having a pitch of 203 nm and a maximum depth of approximately 100 nm are formed in the layers to form the n-type InP layer 33 and the n-type InGaAsP refractive index compensation layers 32 by holographic exposure. Thus, a diffraction grating is formed.

Figure 16C:
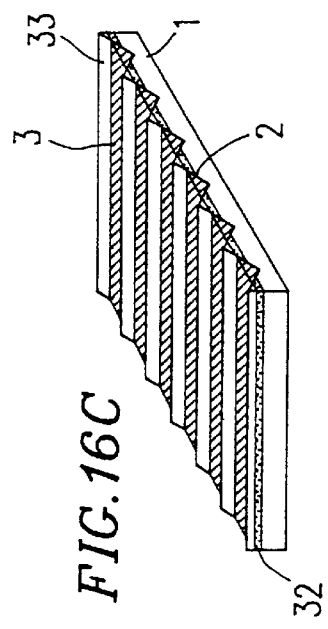
Figure 16D:
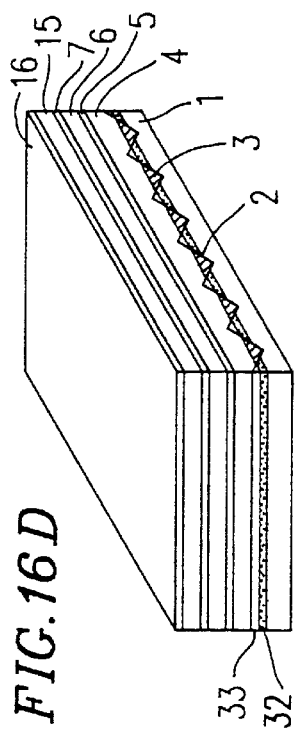
Figure 17C:
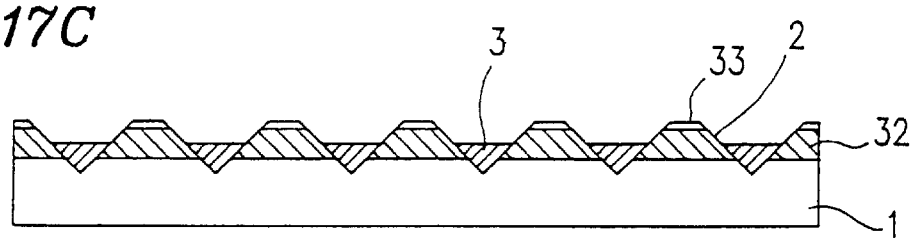
Figure 17D:
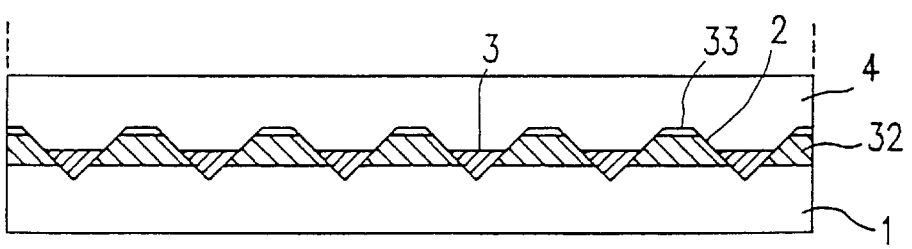
Figure 18:
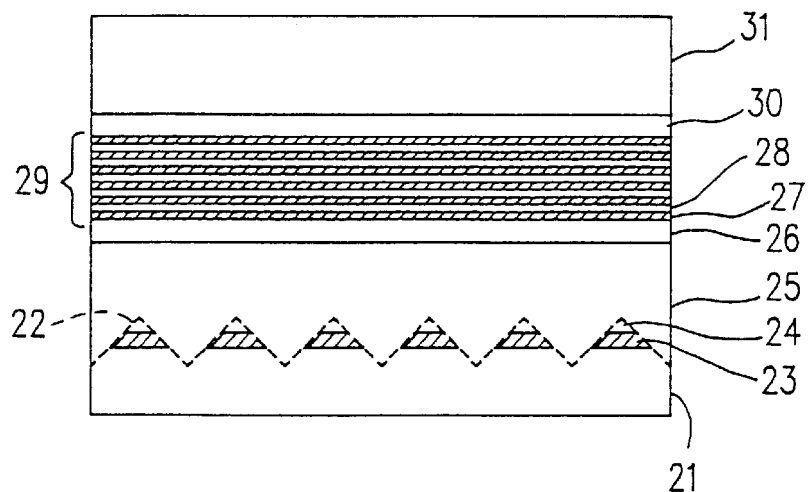
FIG. 18 is a cross sectional view of a conventional DFB laser.
Figure 19A:
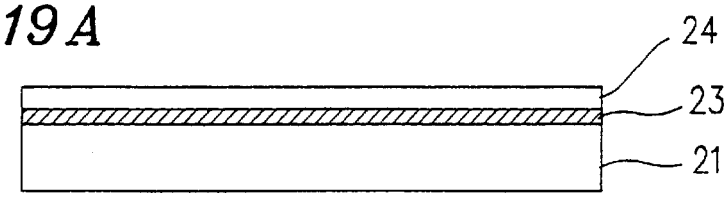
FIG. 19A through 19C are cross sectional views illustrating a method for producing the conventional DFB laser shown in FIG. 18.
Figure 19B:
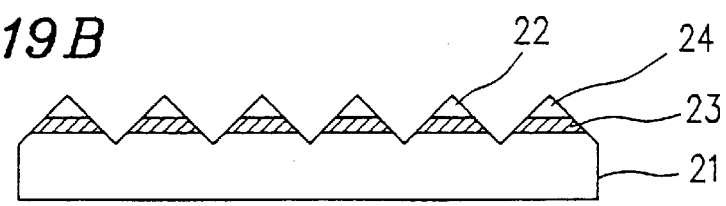
Figure 19C:
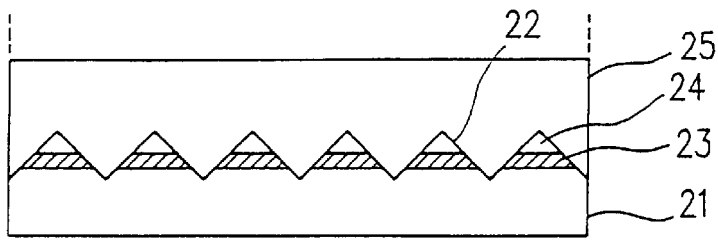

Next, a hydrogen atmosphere is mixed with 100% phosphine ($PH_3$) at a rate 100 cc/min. and 10% arsine ($AsH_3$) at a rate of 10 cc/min. In the resultant atmosphere, the n-type InP substrate 1 is heated at 600° C. As a result, as is shown in FIGS. 16C and 17C, the InAsP absorption layers 3 having a thickness of approximately 50 nm are formed in the grooves of the corrugations 2 to form a diffraction grating. Then, as is shown in FIG. 17D, the n-type InP cladding layer 4 is grown on the corrugations 2. As is shown in FIG. 16D, the n-type InGaAsP optical waveguide layer 5, the MQW active layer 6 having the above-described structure, and the p-type InGaAsP optical waveguide layer 7, the p-type InP cladding layer 15 and a p-type InGaAsP capping layer 16 ($\lambda g=1.3$ $\mu$m) are sequentially grown on the n-type InP cladding layer 4.

Figure 16E:
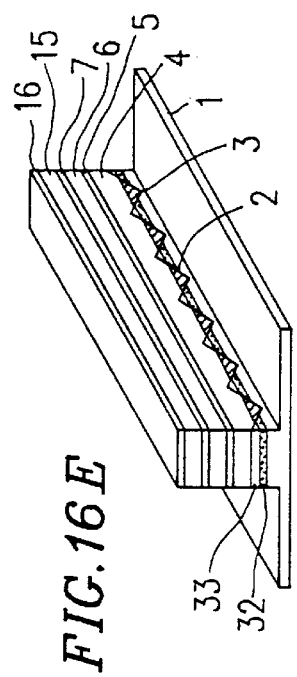
Figure 16F:
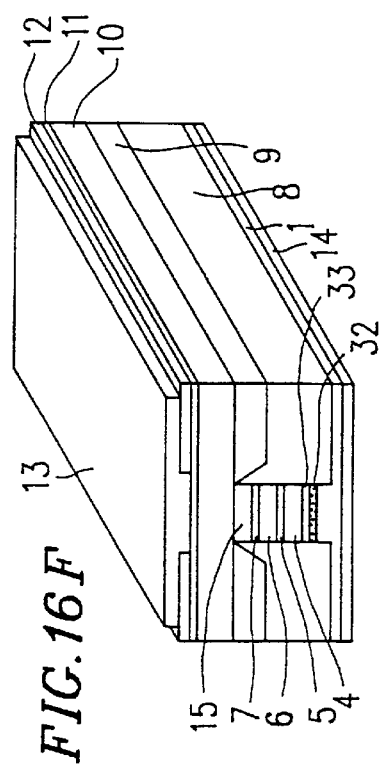

Then, as is shown in FIG. 16E, the mesa stripe is formed by etching. The p-type InP current blocking layer 8, the n-type InP current blocking layer 9, the p-type InP burying layer 10, and the p-type InGaAsP contact layer 11 ($\lambda g=1.3$ $\mu$m) are sequentially grown by liquid phase epitaxy. The insulation layer 12 formed of $SiO_2$ is deposited on the p-type InGaAsP contact layer 11 and a stripe-shaped window is formed. Then, the p-type electrode 13 is formed by evaporation. On the bottom surface of the n-type InP substrate 1, the n-type electrode 14 is formed by evaporation. The resultant body is cleaved to obtain the DFB laser 500 as is shown in FIG. 16F.

EXAMPLE 6

A DFB laser having an integrated modulator is expected as a light source generating an excessively low level of wavelength chirp. With the conventional structure, the production yield is not sufficiently high. In the case of gain coupled type DFB lasers, the production yield in terms of laser oscillation having a single wavelength is satisfactory, but the level of wavelength chirp cannot be sufficiently low.

A gain coupled DFB laser in a sixth example includes absorption layers which are formed periodically without performing etching or re-growth.

Figure 20:
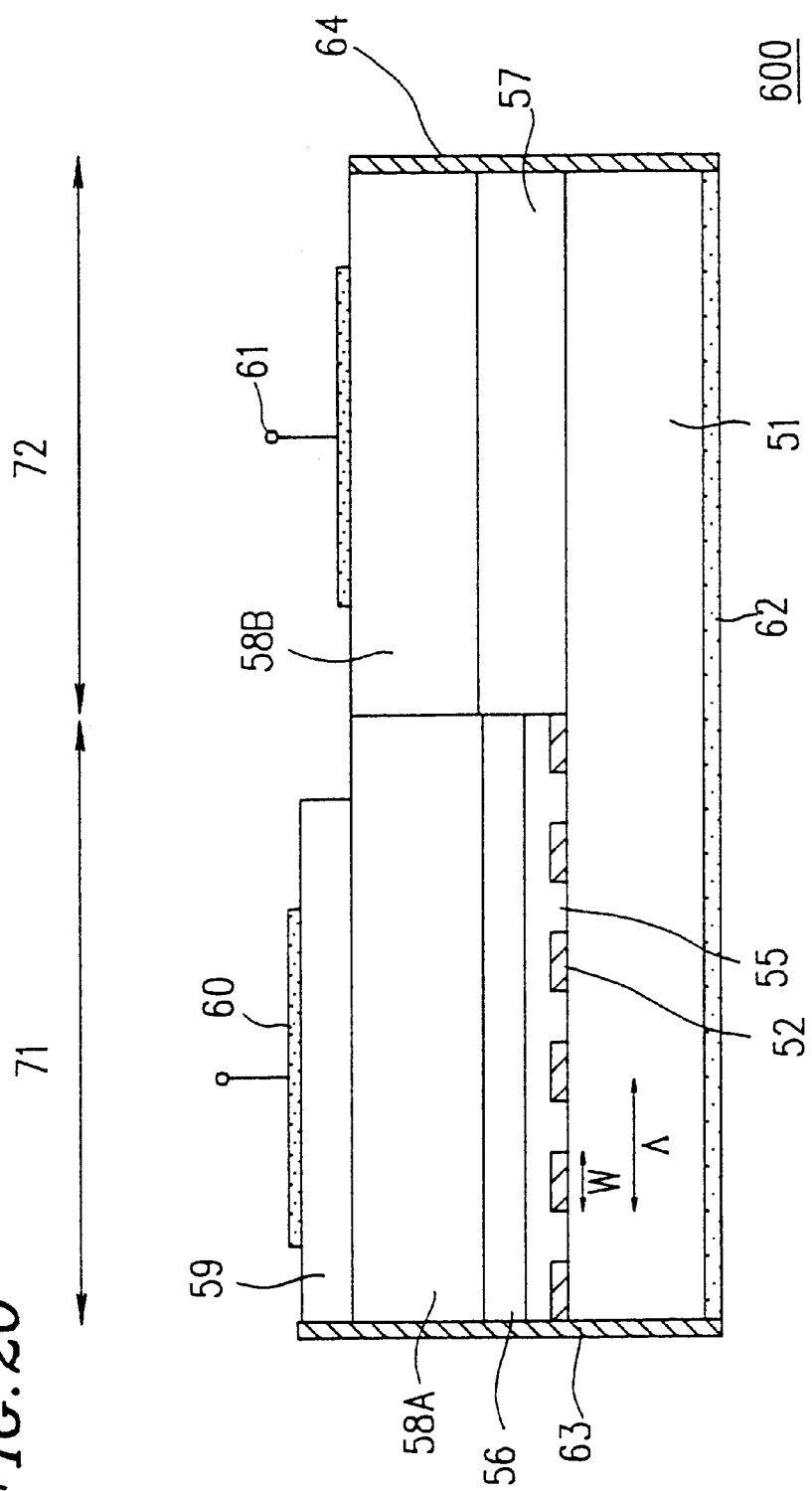
FIG. 20 is a cross sectional view of a DFB laser in a sixth example.

FIG. 20 is a cross sectional view along the cavity length direction of a DFB laser 600 in the sixth example according to the present invention.

The DFB laser 600 includes an emission part 71 for emitting laser light and a modulation part 72 for modulating the laser light. The emission part 71 includes components integrated on an n-type InP substrate 51. The emission part 71 and the modulation part 72 are integrated in a multiple layer structure having a width of approximately 1 to approximately 2 $\mu$m.

In more detail, the emission part 71 includes a plurality of n-type InGaAs absorption layers 52 formed on a surface of the n-type InP substrate 51 to form a periodical absorption type diffraction grating (pitch: 243 nm; $\lambda g=1.68$ $\mu$m; thickness: 30 nm); and an n-type InGaAsP optical waveguide layer 55 (cladding layer) (λg=1.05 μm; thickness: 150 nm), an undoped InGaAsP MQW active layer 56, a p-type InP cladding layer 58A, a p-type InGaAsP contact layer 59, and a p-type electrode 60 which are laminated on the n-type InP substrate 51 covering the n-type InGaAs absorption layers 52.

The modulation part 72 includes an undoped InGaAsP light modulation layer 57 (λg=1.48 μm; thickness: 300 nm), a p-type InP cladding layer 58B, and a p-type electrode 61 which are laminated on the n-type InP substrate 51 in this order.

The p-type electrodes 60 and 61 are electrically separated from each other to be supplied with different potentials. An n-type electrode 62 is formed entirely on a bottom surface of the n-type InP substrate 51 and acts as a common n-type electrode for the emission part 71 and the modulation part 72. Across the p-type electrode 60 and the n-type electrode 62, a constant voltage is supplied by a voltage application device (not shown) to cause an electric current through the emission part 71. As a result, stable laser oscillation is generated. The p-type electrode 61 is supplied with a modulated voltage in a reverse bias state, so that the optical characteristics of the undoped light modulation layer 57 are changed in accordance with the applied voltage.

An end surface of the DFB laser 600 on the side of the modulation part 72, namely, an end surface from which the laser light is to be emitted (front end), is coated with a low reflection film 64 having a reflectivity of 0.1%. The other end surface of the DFB laser 600, namely, the end surface on the side of the emission part 71 (back end) is coated with a high reflection film 63 having a reflectivity of 90%. Due to such a structure, a large optical output is obtained from the front end of the DFB laser 600.

The MQW active layer 56 includes a plurality of InGaAsP strain well layers (thickness: 6 nm; compression strain: 1%) and a plurality of barrier layers (thickness: 10 nm; λg=1.3 μm) laminated alternately. In this example, seven quantum wells are provided. As a result of measuring the photoluminescence from the MQW active layer 56, the effective bandgap wavelength ($\lambda_{PL}$) of the MQW active layer 56 was found to be 1.56 μm.

The n-type InGaAs absorption type diffraction grating includes a plurality of light absorption layers 52 (thickness: 30 nm) regularly arranged in the cavity length direction (optical axis direction). The light absorption layers 52 each have a width (W) of 50 nm and are arranged at a pitch (Λ) of 243 nm. In such a structure, the absorption coefficient (namely, gain) of the light generated from the MQW active layer 56 changes periodically along the cavity length direction. Thus, a gain coupled cavity is formed. Due to such a cavity, laser oscillation having a single wavelength at the Bragg wavelength (1.55 μm) or the vicinity thereof when the current is injected to the emission part 71.

The modulation part 72 modulates the laser light generated by the emission part 71 by the electric field absorption effect caused by application of a voltage in the reverse bias state. In this example, the oscillation threshold current in the emission part 71 was 20 mA, and the optical output from the front end in the modulation part 72 in the state of being supplied with no bias voltage was 10 mW. When a reverse bias voltage of 2 V was applied, an extinction ratio of 20 dB was obtained.

A method for producing the DFB laser 600 will be described, hereinafter.

On a top surface of the n-type InP substrate 51, an n-type InGaAs film is grown by a first step of MOVPE. The n-type InGaAs film is treated by holographic exposure and etching to form the n-type InGaAs absorption layers 52 to form a diffraction grating having a pitch of 243 nm only in the area corresponding to the emission part 71.

Next, the n-type InGaAsP optical waveguide layer 55, the undoped InGaAsP MQW active layer 56, the p-type InP cladding layer 58A, and the p-type InGaAsP contact layer 59 are grown on the entire top surface of the n-type InP substrate 51, covering the n-type InGaAs absorption type diffraction grating. In the area corresponding to the modulation part 72, the semiconductor layers thus grown are removed. In detail, an area of a top surface of the p-type InGaAsP contact layer 59 corresponding to the emission part 71 is masked by SiO$_2$, and the resultant lamination is etched by a mixture solution of H$_2$SO$_4$:H$_2$O$_2$:H$_2$O=5:1:1 to remove a part of the p-type InGaAsP contact layer 59 corresponding to the modulation part 72. Then, the p-type InP cladding layer 58A is etched by a mixture of HCl:H$_3$PO$_3$=1:2, the undoped InGaAsP MQW active layer 56 and the n-type InGaAsP optical waveguide layer 55 are etched by H$_2$SO$_4$:H$_2$O$_2$:H$_2$O=5:1:1, to remove a part of the respective layers corresponding to the modulation part 72. On the area of the n-type InP substrate 51 exposed by such etching, the undoped InGaAsP light modulation layer 57 and the p-type InP cladding layer 58B are grown by a third step of MOVPE. Thus, the modulation part 72 is formed.

Then, in order to confine a current and light in the lateral direction, the above-formed semiconductor layers are patterned to be a stripe. In detail, after an SiO$_2$ stripe mask pattern having a width of approximately 1 to 2 μm and extending in the cavity length direction is formed, the p-type InP cladding layer 58A and p-type InP cladding layer 58B are masked by the SiO$_2$ stripe mask pattern, and the exposed parts thereof are removed. Thereafter, another cladding layer (not shown) is formed both in the emission part 71 and the modulation part 72, and an SiO$_2$ passivation film (not shown) is formed on the entire surface of the resultant lamination. Contact windows are formed in the SiO$_2$ passivation film in one prescribed area in the emission part 71 and one prescribed area in the modulation part 72. The p-type electrodes 60 and 61 are formed in the respective contact windows, and the n-type electrode 62 is formed on the bottom surface of the n-type InP substrate 51.

Hereinafter, characteristics of the DFB laser 600 will be described.

In the conventional DFB laser having an emission part of the refractive index coupled type, production yield in terms of laser oscillation having a single wavelength is only approximately 30%. Such a low production yield is caused by processing fluctuations in the phase at the both ends, which is inevitable in this type of laser, in addition to processing fluctuations in the diffraction grating. In the DFB laser 600 of the gain coupled type, laser oscillation having a single wavelength is generated at a high possibility to realize the production yield of 60% or more.

In the DFB laser 600, the hole burning in the axis direction and the phase fluctuation caused by the change in the refractive index are smaller than in the conventional DFB laser of the refractive index coupled type. For these reasons, the change in the oscillation wavelength caused by the light returning from the front end is smaller. In the case of the conventional DFB laser of the refractive index coupled type, the yield of obtaining the wavelength chirp of 0.02 nm or less when converted into a digital signal is only approximately 10% even when the reflectivity of the front end is as low as 0.1% or less. In the DFB laser 600, the yield of obtaining the above-mentioned wavelength chirp is twice as high when the reflectivity of the front end is 0.1% or less.

Even in the case when the reflectivity of the front end is 0.2%, such a yield of the DFB laser 600 is approximately the same as the yield of the conventional DFB laser obtained when the reflectivity is only 0.1%. This indicates that less strictness is allowed for controlling the thickness of the reflection film in the production of the DFB laser, which facilitates the production. Such freedom in the production makes possible to form a window structure in the vicinity of the front end, and also to provide a semi-insulation layer between the emission part 71 and the modulation part 72 for increasing the resistance between the emission part 71 and the modulation part 72. Needless to say, these extra steps improve the characteristics of the DFB laser 600.

In the DFB laser 600, the active layer and the light modulation layer can be a bulk layer or a MQW layer. The structure of the MQW layer and the light modulation layer can be designed independently from the other layers. In modulation into an analog signal, the spectral line width and the level of wavelength chirp are related to an increase of the noise and modulation strain caused by the multiple reflection on the light transmission path. In order to restrict such noise and strain, a low level of wavelength chirp and a large spectral line width are effective. In general direct modulation of the laser light, the level of wavelength chirp and the spectral line width are both related with a line width enhancement factor. In other words, as the wavelength chirp is reduced, the spectral line width is also reduced. In the structure of the DFB laser 600, an excessively low level of chirp can be obtained with a large spectral line width by use of a bulk active layer. Such a DFB laser can be used in a wider range of transmission paths.

In the DFB laser 600, the coupling efficiency between the emission part 71 and the modulation part 72 is approximately 90%. Such a high coupling efficiency is realized because the light modulation layer 57 and the active layer 56 are formed on the same optical axis at a high level of precision by use of selective etching.

The absorption type diffraction grating 52 is formed below the active layer 56 in the semiconductor laser device shown in FIG. 20 but can be formed above the active layer 56 with the same effects.

The cladding layer is used to confine the current and light in this example. A buried structure can also be used, which is formed by another step of crystal growth.

EXAMPLE 7

Figure 21:
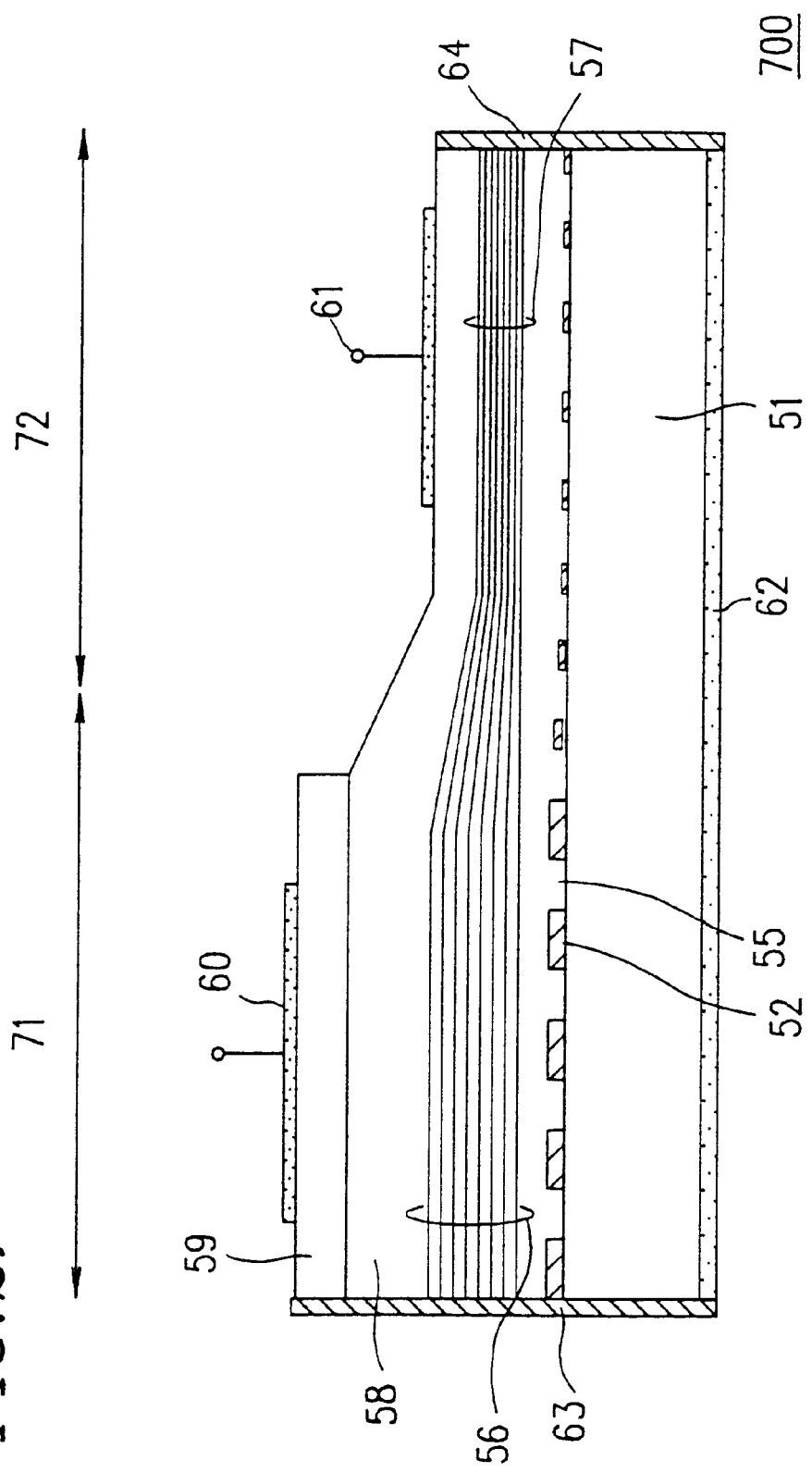
FIG. 21 is a cross sectional view of a DFB laser in a seventh example.

FIG. 21 is a cross sectional view along the cavity length direction of a DFB laser 700 in a seventh example according to the present invention. Identical elements as those in the sixth example will bear identical reference numerals therewith and a description thereof will be omitted.

The DFB laser 700 includes an emission part 71 for emitting laser light and a modulation part 72 for modulating the laser light. The emission part 71 includes components integrated on an n-type InP substrate 51. The emission part 71 and the modulation part 72 are integrated in a striped multiple layer structure having a width of approximately 1 to approximately 2 $\mu$m. The emission part 71 and the modulation part 72 have substantially the same structure except for the thicknesses thereof.

In more detail, the emission part 71 includes a plurality of n-type InGaAs light absorption layers 52 formed on a surface of the n-type InP substrate 51 to form a periodical absorption type diffraction grating (pitch: 243 nm; $\lambda$g=1.68 $\mu$m; thickness: 10 nm); and an n-type InGaAsP optical waveguide layer 55 (cladding layer) ($\lambda$g=1.05 $\mu$m; thickness: 150 nm), an undoped InGaAsP MQW active layer 56, a p-type InP cladding layer 58, a p-type InGaAsP contact layer 59, and a p-type electrode 60 which are laminated on the n-type InP substrate 51 covering the n-type InGaAs light absorption layers 52.

The modulation part 72 includes an n-type InGaAsP optical waveguide layer 55 ($\lambda$g=1.05 $\mu$m; thickness: 75 nm), an-undoped InGaAsP light modulation layer 57, a p-type InP cladding layer 58, and a p-type electrode 61 which are laminated on the n-type InP substrate 51 in this order.

In this example, the n-type InGaAs light absorption layers 52 are formed in the modulation part 72 as well as in the emission part 71. However, the n-type InGaAs absorption layers 52 in the modulation part 72 each have a thickness of only approximately 5 nm or less and thus does not substantially function as a light absorption layer for the reason described later.

The undoped InGaAsP MQW active layer 56 in the modulation part 72 includes a first part of a multiple layer quantum well formed in the striped multiple layer structure, and the undoped InGaAsP light modulation layer 57 includes a second part of the multiple layer quantum well. The multiple layer quantum well includes a plurality of InGaAsP well layers ($\lambda$g as a bulk=1.62 $\mu$m) and a plurality of InGaAsP barrier layers ($\lambda$g=1.30 $\mu$m) laminated alternately (so as to form ten pairs). The multiple layer quantum well has a thickness of 180 nm in the emission part 71 and 90 nm in the modulation part 72. In a transition part between the emission part 71 and the modulation part 72, the thickness of the multiple layer quantum well gradually changes from 180 nm to 90 nm.

The p-type electrodes 60 and 61 are electrically separated from each other to be supplied with different potentials. An n-type electrode 62 is formed entirely on a bottom surface of the n-type InP substrate 51 and acts as a common n-type electrode for the emission part 71 and the modulation part 72. The p-type electrode 60 and the n-type electrode 62 are supplied with substantially equal voltages by a voltage application device (not shown) to cause an electric current through the emission part 71. As a result, stable laser oscillation is generated. The p-type electrode 61 is supplied with a modulated voltage in a reverse bias state, so that the optical characteristics of the undoped light modulation layer 57 are changed in accordance with the applied voltage.

An end surface of the DFB laser 600 on the side of the modulation part 72, namely, an end surface from which the laser light is to be emitted (front end), is coated with a low reflection film 64 having a reflectivity of 0.1%. The other end surface of the DFB laser 700, namely, the end surface on the side of the emission part 71 (back end) is coated with a high reflection film 63 having a reflectivity of 90%. Due to such a structure, a large optical output is obtained from the emission end of the DFB laser 700.

The absorption type diffraction grating includes a plurality of n-type InGaAs light absorption layers 52 (thickness: 10 nm) regularly arranged in the cavity length direction (optical axis direction). The n-type InGaAs light absorption layers 52 each have a width (W) of 50 nm and are arranged at a pitch (A) of 243 nm. In such a structure, the absorption coefficient (namely, gain) of the light generated from the MQW active layer 56 changes periodically along the cavity length direction. Thus, a gain coupled cavity is formed. Due to such a cavity, laser oscillation having a single wavelength (1.55 $\mu$m) at the Bragg wavelength or the vicinity thereof is obtained when the current is injected to the emission part 71.

The modulation part 72 modulates the laser light generated by the emission part 71 by the electric field absorption effect caused by application of a voltage in the reverse bias state. In this example, the oscillation threshold current in the emission part 71 was 20 mA, and the optical output from the outgoing end in the modulation part 72 in the state of being supplied with no bias voltage was 10 mW. When a reverse bias voltage of 2 V was applied, an extinction ratio of 20 dB was obtained.

In the DFB laser 700, the n-type InGaAs light absorption layers 52, the MQW active layer 56 and the undoped InGaAsP light modulation layer 57 are thicker in the emission part 71 than in the modulation part 72. In this example, the thickness of each of the layers 52, 56 and 57 in the modulation part 72 is half the thickness thereof in the emission part 71. As a result, the quantum shift quantity in each of the layers 52, 56 and 57 depends on the thickness thereof. The effective bandgap wavelength of the MQW active layer 56 in the emission part 71 is 1.56 $\mu$m (well thickness: 8 nm), and the effective bandgap wavelength of the light modulation layer 57 in the modulation part 72 is 1.49 $\mu$m (well thickness: 4 nm). The effective bandgap wavelength of the n-type InGaAs light absorption layers 52 is 1.58 $\mu$m (well thickness: 10 nm) in the emission part 71 and is 1.48 $\mu$m (well thickness: 4 nm) in the modulation part 72. The n-type InGaAs light absorption layers 52 have a large wavelength shift quantity because of the quantum well structure thereof sandwiched by the n-type InP substrate 51 and the n-type InGaAsP optical waveguide layer 55 ($\lambda$g= 1.05 $\mu$m) both having a high barrier.

The n-type InGaAs light absorption layer 52 has a width of 50 nm in the cavity length direction and is arranged at a pitch of 243 nm. The gain coupled is achieved by the periodical change in the absorption coefficient, namely, the periodical change in the gain in the cavity length direction. Accordingly, laser oscillation having a single wavelength at the Bragg wavelength or the vicinity thereof is obtained when the current is injected to the emission part 71.

When a forward bias voltage is applied to the emission part 71 to inject an electric current, laser oscillation having a single wavelength of 1.55 $\mu$m is generated by gain coupling. The laser light which has achieved the modulation part 72 is modulated by application of a reverse bias voltage. Since the emission part 71 and the modulation part 72 are formed of layers grown in the same crystal growth step and thus are continuous, the optical coupling ratio is close to 100%. Further, since the undoped InGaAsP light modulation layer 57 and the n-type InGaAs light absorption layers 52 in the modulation part 72 have a sufficiently higher bandgap energy level than the energy level of the laser light although these layers are formed in the same step with those in the emission part 71, the laser light is propagated through the modulation part 72 with little loss. Due to such a low level of optical loss, when a driving current of 100 mA is supplied to the emission part 71, an optical output as high as 10 mW or more is obtained from the outgoing end of the modulation part 72. The level of wavelength chirp is as low as in the sixth example. Although the modulation part 72 includes the periodical absorption type diffraction grating in this example, the effective refractive index in the modulation part 72 is smaller than the effective refractive index in the emission part 71. Thus, the Bragg wavelength in the modulation part 72 is sufficiently shorter than the wavelength of the laser light. Accordingly, the laser light is scarcely diffracted by the absorption type diffraction grating.

A method for producing the DFB laser 700 will be described, hereinafter.

A top surface of the n-type InP substrate 51 is covered by an SiO$_2$ mask having two stripes extending in the cavity length direction. An example of the mask is shown in FIG. 25B. The two stripes of the SiO$_2$ mask are arranged with an opening therebetween having a width of 10 $\mu$m, and the width of each stripe of the SiO$_2$ mask is set to be, for example, 30 $\mu$m in the area corresponding to the emission part 71, and set to be 10 $\mu$m in the area corresponding to the modulation part 72. Due to the difference in the width, the width of exposed areas (openings) in the emission part 71 is different from the width of openings in the modulation part 72. Accordingly, the crystal growth rate after this step is different in the parts 71 and 72. The crystal growth rate is lower in the part having larger openings (the modulation part 72) than the other part (the emission part 71). The shape of the mask for causing such different crystal growth rates is not limited to the one shown in FIG. 25B. The mask can also be formed of a specific semiconductor material other than SiO$_2$ or a non-amorphous insulation material such as silicon nitride.

Next, an n-type InGaAs film is grown on the openings by a first step of MOVPE. The thickness of the n-type InGaAs film depends on the width of the openings. In this example, the thickness is 10 nm in the area corresponding to the emission part 71 and 5 nm in the area corresponding to the modulation part 72.

Then, the n-type InGaAs film is treated by holographic exposure and etching to form the n-type InGaAs light absorption layers 52 to form a diffraction grating having a pitch of 243 nm.

Next, in the state where the SiO$_2$ is left, the n-type InGaAsP optical waveguide layer 55, the undoped InGaAsP MQW active layer 56, the p-type InP cladding layer 58, and the p-type InGaAsP contact layer 59 are grown selectively on prescribed areas by a second step of MOVPE. The thickness of each layer depends on the width of the opening of the SiO$_2$, and thus a desirable thickness difference is achieved between the emission part 71 and the modulation part 72.

Then, in order to confine a current and light in the lateral direction, another cladding layer (not shown) is formed in the same manner as in the sixth example. An SiO$_2$ passivation film (not shown) is formed on the entire surface of the resultant lamination. Holes are formed in the SiO$_2$ passivation film in one prescribed area in the emission part 71 and one prescribed area in the modulation part 72. The p-type electrodes 60 and 61 are formed in the respective holes, and the n-type electrode 62 is formed on the bottom surface of the n-type InP substrate 51.

In such a production method, the planar layout of the striped lamination is determined by only one masking step. Further, formation of the semiconductor layers requires only two crystal growth steps, one before and the other after the formation of the diffraction grating. Especially, the use of a mask having openings which have different widths for the emission part 71 and the modulation part 72 has a remarkable advantage that the formation of the multiple layer structure is significantly facilitated by self alignment with the openings.

In this example, the thickness of each layer is controlled by the width of the openings of the mask. Alternatively, such control can be performed by the width of further holes formed in the mask so as to interpose the openings. The multiple layer structure can be formed on a mesa stripe having a changing width and formed on the top surface of the n-type InP substrate 51.

EXAMPLE 8

Figure 22:
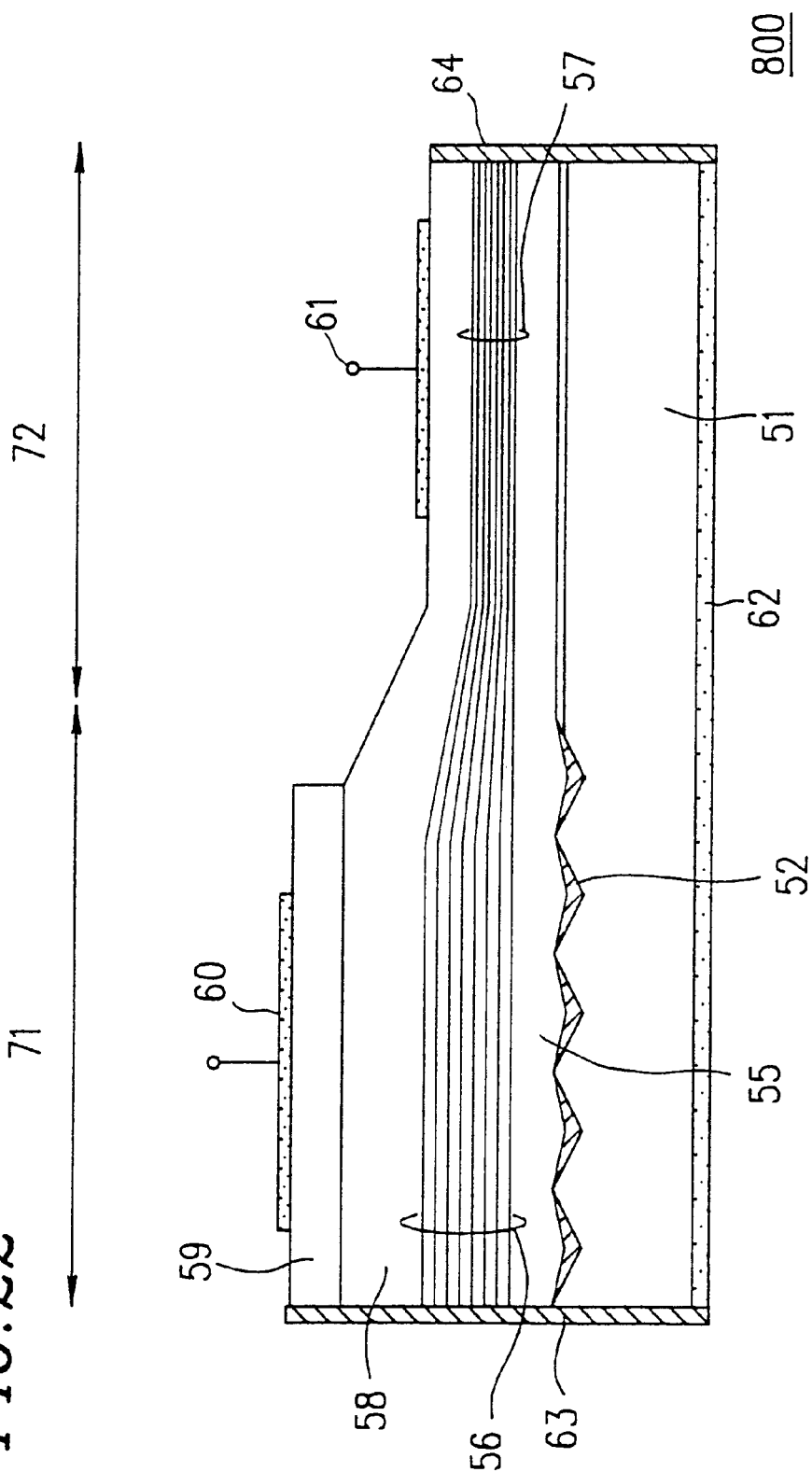
FIG. 22 is a cross sectional view of a DFB laser in an eighth example.

FIG. 22 is a cross sectional view along the cavity length direction of a DFB laser 800 in an eighth example according to the present invention. Identical elements as those in the sixth example will bear identical reference numerals therewith and a description thereof will be omitted.

The DFB laser 800 includes an emission part 71 for emitting laser light and a modulation part 72 for modulating the laser light. The emission part 71 includes components integrated on an n-type InP substrate 51. The emission part 71 and the modulation part 72 are integrated in a striped multiple layer structure having a width of approximately 1 to approximately 2 μm. The emission part 71 and the modulation part 72 have substantially the same structure except for the thicknesses thereof.

In more detail, the emission part 71 includes a plurality of n-type InGaAs light absorption layers 52 which are formed on a corrugated top surface of the n-type InP substrate 51 to form a periodical absorption type diffraction grating (pitch: 243 nm; λg=1.68 μm; thickness: 30 nm); and an n-type InGaAsP optical waveguide layer 55 (cladding layer) (λg=1.05 μm; thickness: 150 nm), an undoped InGaAsP MQW active layer 56, a p-type InP cladding layer 58, a p-type InGaAsP contact layer 59, and a p-type electrode 60 which are laminated on the n-type InGaAs light absorption layers 52 in this order.

The modulation part 72 includes an n-type InGaAsP optical waveguide layer 55 (λg=1.05 μm; thickness: 70 nm), an undoped InGaAsP light modulation layer 57, a p-type InP cladding layer 58, and a p-type electrode 61 which are laminated on the n-type InGaAs light absorption layers 52.

The DFB laser 800 has the same structure with that of the DFB laser 700 except for the n-type InGaAs absorption type diffraction grating.

A plurality of striped n-type InGaAs light absorption layers 52 are formed on the corrugated top surface of the n-type InP substrate 51 to form an absorption type diffraction grating. The n-type InGaAs light absorption layers 52 extend in a direction perpendicular to the cavity length direction and formed selectively in the area corresponding to the emission part 71. Each n-type InGaAs light absorption layer 52 has a maximum thickness of 20 nm (effective λg=1.6 μm) in the groove of the corrugations, but has a thickness of only several nanometers or less (PL wavelength>1.3 μm) on the ridge of the corrugations. The thickness of the n-type InGaAs light absorption layers 52 changes periodically in accordance with the corrugations of the n-type InP substrate 51. Thus, the thickness of the n-type InGaAs light absorption layers 52 changes periodically in accordance with the positional change in the bandgap. In this example, the n-type InGaAs light absorption layers 52 need not be separated from each other, but it is sufficient as long as the thickness thereof changes periodically in the cavity length direction. The n-type InGaAs light absorption layers 52 can be separated from each other, in which case no layer is existent on the ridges of the corrugations. In the modulation part 72, the thickness of the n-type InGaAs light absorption layers 52 is 4 nm.

The MQW active layer 56 has a well thickness of 8 nm and an effective bandgap wavelength (λg) of 1.56 μm. The undoped InGaAsP light modulation layer 57 has a well thickness of 4 nm and an effective bandgap wavelength (λg) of 1.48 μm.

A method for producing the DFB laser 800 will be described, hereinafter.

On an area of a top surface of the n-type InP substrate 51 corresponding to the emission part 71, corrugations having a pitch of 243 nm and a maximum depth of approximately 50 to 100 nm are selectively formed by holographic exposure and etching.

On such a corrugated top surface of the n-type InP substrate 51, an $SiO_2$ mask having a plurality of stripes extending in the cavity length direction is formed. In the area corresponding to the emission part 71, each stripe has a width of 30 μm and are arranged with an opening therebetween having a width of 10 μm. In the area corresponding to the modulation part 72, each stripe has a width of 10 μm and are arranged with an opening therebetween having a width of 10 μm. Each stripe is wider in the area corresponding to the emission part 71 than in the area corresponding to the modulation part 72.

Next, the n-type InGaAs light absorption layers 52, the n-type InGaAsP optical waveguide layer 55, the undoped InGaAsP MQW active layer 56, the undoped InGaAsP light modulation layer 57, the p-type InP cladding layer 58, and the p-type InGaAsP contact layer 59 are grown on the n-type InP substrate 51 by MOVPE in the openings of the $SiO_2$ mask. The thickness of each layer depends on the width of the openings, and is different in the emission part 71 and the modulation part 72. Since the crystal growth rate is different in an area corresponding to the ridge of the corrugations and an area corresponding to the groove of the corrugations, the thickness of the n-type InGaAs light absorption layers 52 changes periodically as is shown in FIG. 22.

Then, in order to confine a current and light in the lateral direction, another cladding layer (not shown) is formed in the same manner as in the sixth example. An $SiO_2$ passivation film (not shown) is formed on the entire surface of the resultant lamination. Holes are formed in the $SiO_2$ passivation film in one prescribed area in the emission part 71 and one prescribed area in the modulation part 72. The p-type electrodes 60 and 61 are formed in the respective holes, and the n-type electrode 62 is formed on the bottom surface of the n-type InP substrate 51.

In such a production method, the planar layout of the striped lamination is determined by only one masking step. Further, formation of the semiconductor layers requires only one crystal growth step after the formation of the diffraction grating. Especially, the use of a mask having openings which have different widths for the emission part 71 and the modulation part 72 has a remarkable advantage in that the formation of the multiple layer structure is significantly facilitated by self alignment with the openings. The advantage that the formation of the semiconductor layers requires only one continuous crystal growth step significantly simplifies the formation process of a complicated integrated structure, since crystal growth is one of the most time and labor consuming process steps in the production of the laser.

In the DFB laser 800 in this example, the same satisfactory effects as in the seventh example have been confirmed. Further, the DFB laser 800 has another advantage that the diffraction grating can be formed by processing InP which is relatively easy in shape control by etching. Moreover, since the diffraction grating is formed simply by growing the light absorption layers 52 by MOVPE instead of deposition and etching, the periodical change in the absorption coefficient can be obtained with certainty even if the shape of the corrugations is not perfectly uniform. Accordingly, even if wet etching is used to form the corrugations at a surface of the n-type InP substrate 51 by wet etching, the characteristics of the DFB laser 800 are relatively stable.

EXAMPLE 9

Figure 23:
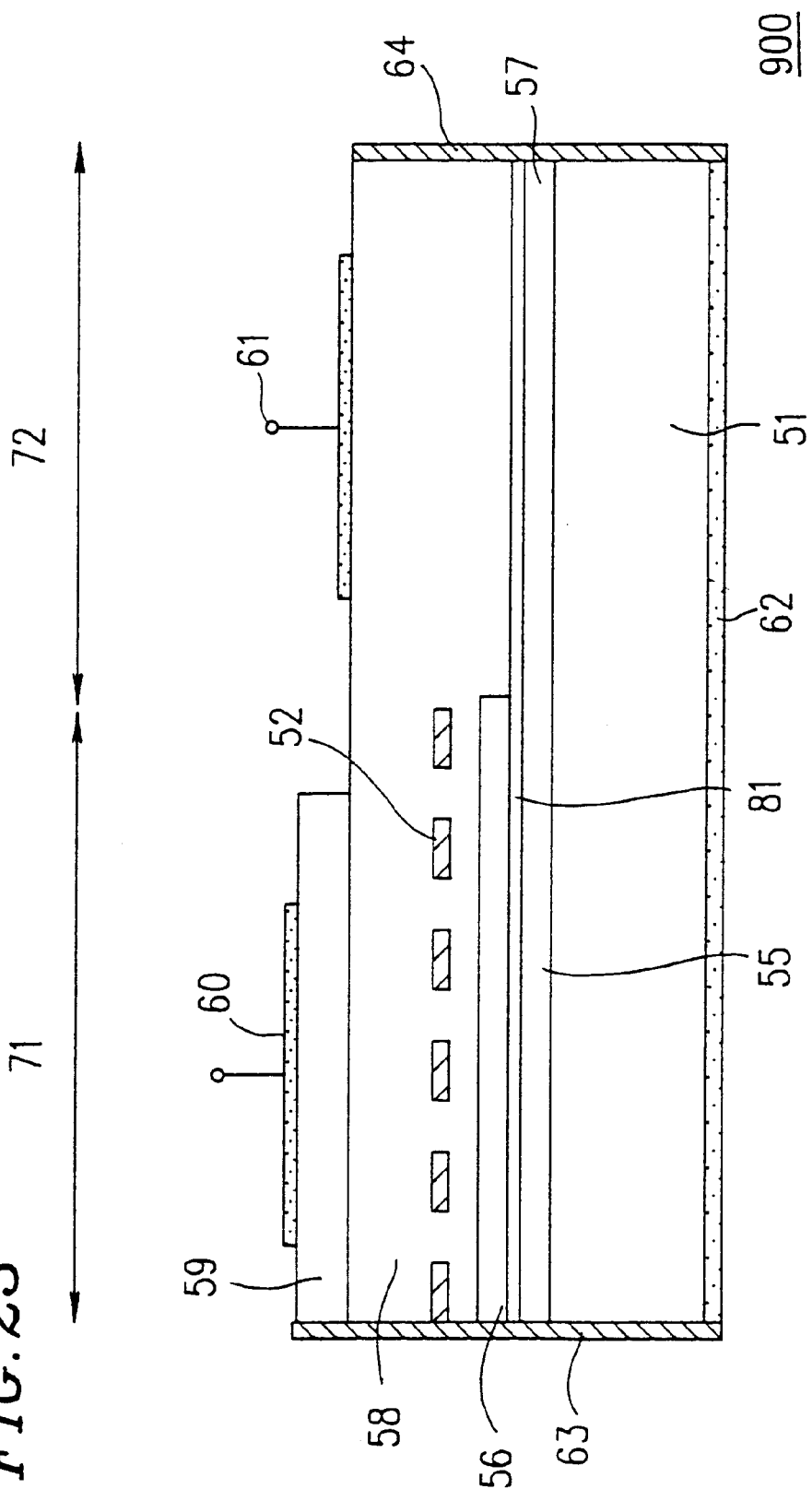
FIG. 23 is a cross sectional view of a DFB laser in a ninth example.

FIG. 23 is a cross sectional view along the cavity length direction of a DFB laser 900 in a ninth example according to the present invention. Identical elements as those in the sixth example will bear identical reference numerals therewith and a description thereof will be omitted.

The DFB laser 900 includes an emission part 71 for emitting laser light and a modulation part 72 for modulating the laser light. The emission part 71 includes components integrated on an n-type InP substrate 51. The emission part 71 and the modulation part 72 are integrated in a striped multiple layer structure having a width of approximately 1 to approximately 2 $\mu$m.

In more detail, the emission part 71 includes an undoped InGaAsP optical waveguide layer 55 (cladding layer) ($\lambda$g= 1.48 $\mu$m; thickness: 0.5 $\mu$m), an undoped InP spacer layer 81 (thickness: 0.1 $\mu$m), an undoped InGaAsP active layer 56 ($\lambda$g=1.55 $\mu$m; thickness: 0.1 $\mu$m), a p-type InP cladding layer 58, a p-type InGaAsP contact layer 59, and a p-type electrode 60 which are laminated on the n-type InP substrate 51 in this order. The p-type InP cladding layer 58 includes a plurality of n-type InGaAs light absorption layers 52 forming a periodical absorption type diffraction grating at a level away from the active layer 56 by a prescribed distance. The light absorption layers 52 forming the n-type InGaAs absorption type diffraction grating are periodically arranged at a pitch of 230 nm along the cavity length direction.

The modulation part 72 includes an undoped InGaAsP light modulation layer 57 (composition wavelength: 1.48 $\mu$m), an undoped InP spacer layer 81, a p-type InP cladding layer 58, and a p-type electrode 61 which are laminated on the n-type InP substrate 51 in this order. The n-type InP substrate 51 has an n-type electrode 62 on a bottom surface thereof.

The outgoing end of the modulation part 72 is coated with a low reflection film 64 having a reflectivity of 0.1%, and the emission end of the emission part 71 is coated with a high reflection film 63 having a reflectivity of 90%. Due to such a structure, a large optical output is obtained from the outgoing end.

In the DFB laser 900, the optical waveguide layer 55 and the light modulation layer 57 are formed of the same semiconductive material. The spacer layer 81 is also formed in the same semiconductive material in the emission part 71 and the modulation part 72.

A method for producing the DFB laser 900 will be described, hereinafter.

On a top surface of the n-type InP substrate 51, the undoped InGaAsP optical waveguide layer 55, the undoped spacer layer 81, the undoped InGaAsP active layer 56, a p-type InP cladding layer, and an n-type InGaAsP contact layer are grown on the n-type InP substrate 51 by MOVPE. Then, the n-type InGaAs layer is treated with holographic exposure and etching to form a plurality of the n-type InGaAs light absorption layers 52 arranged at a pitch of 230 nm in the cavity length direction.

After an area of a top surface of the p-type InP cladding layer 58 corresponding to the emission part 71 is covered with a SiO$_2$ mask, the n-InGaAs contact layer in the area corresponding to the modulation part 72 is selectively etched away by a mixture solution of H$_2$SO$_4$:H$_2$O$_2$:H$_2$O=5:1:1. Then, the p-type InP cladding layer is etched by a mixture of HCl:H$_3$PO$_4$=1:2, the undoped InGaAsP MQW active layer 56 and the n-type InGaAsP optical waveguide layer 55 are etched by H$_2$SO$_4$:H$_2$O$_2$:H$_2$O=5:1:1, to remove a part of the respective layers corresponding to the modulation part 72.

Then, by a second step of MOVPE, the p-type cladding layer 58 and the p-type InGaAsP contact layer 59 are grown.

Then, in order to confine a current and light in the lateral direction, an SiO$_2$ mask having stripes extending in the cavity pattern is formed, and the layers to the p-type InP cladding layer 58 are removed. Then, another cladding layer (not shown) is formed in each of the emission part 71 and the modulation part 72. An SiO$_2$ passivation film (not shown) is formed on the entire surface of the resultant lamination. Holes are formed in the SiO$_2$ passivation film in one prescribed area in the emission part 71 and one prescribed area in the modulation part 72. The p-type electrodes 60 and 61 are formed in the respective holes, and the n-type electrode 62 is formed on the bottom surface of the n-type InP substrate 51.

In such a production method, the planar layout of the striped lamination is determined by only one masking step. Further, formation of the semiconductor layers requires only two crystal growth steps, one before and one after the formation of the diffraction grating. Moreover, an arbitrary structure can be selected for the active layer 56 and the light modulation layer 57 within the range in which characteristics of the laser in the emission part 71 and the optical coupling between the emission part 71 and the modulation part 72 are not deteriorated. For example, the active layer 56 and the light modulation layer 57 can each have a bulk structure or an MQW structure. In the case of the bulk structure is used, the wavelength chirp can be reduced without reducing the spectral line width of the light source. Such an advantage is effective in restricting additional strain and noise on the analog light transmission path having multiple reflectivity. Thus, a wide range of the spectral line width can be provided by a simple production process.

EXAMPLE 10

Figure 24:
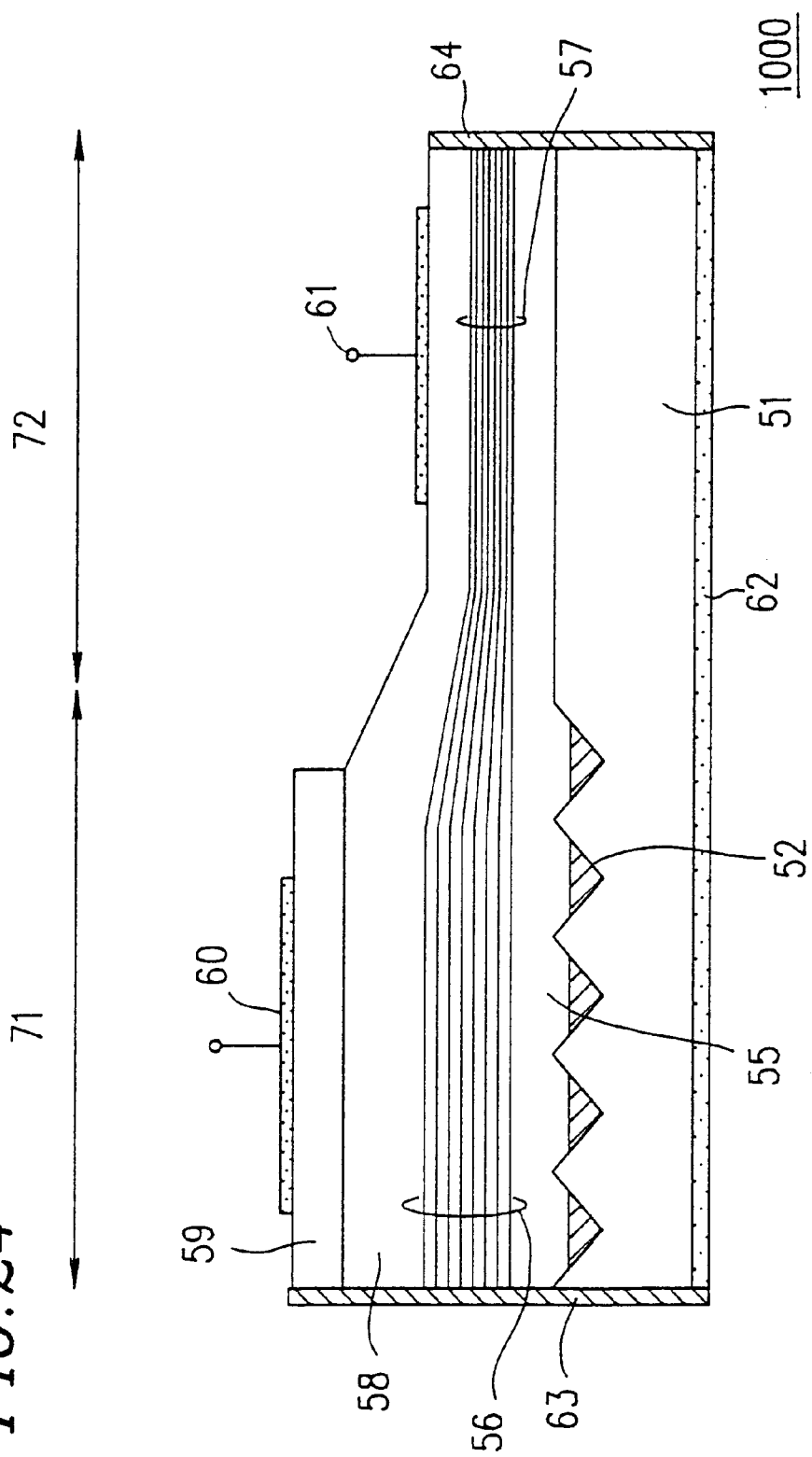
FIG. 24 is a cross sectional view of a DFB laser in a tenth example.

FIG. 24 is a cross sectional view along the cavity length direction of a DFB laser 1000 in a tenth example according to the present invention. Identical elements as those in the sixth example will bear identical reference numerals therewith and a description thereof will be omitted.

The DFB laser 1000 includes an emission part 71 for emitting laser light and a modulation part 72 for modulating the laser light. The emission part 71 includes components integrated on an n-type InP substrate 51. The emission part 71 and the modulation part 72 are integrated in a striped multiple layer structure having a width of approximately 1 to approximately 2 $\mu$m. The emission part 71 and the modulation part 72 have substantially the same structure except for the thicknesses thereof.

In more detail, the emission part 71 includes a plurality of n-type InAsP light absorption layers 52 formed on corrugations formed at surface of the n-type InP substrate 51 to form a diffraction grating periodically arranged at a pitch of 201 nm ($\lambda$g=1.4 $\mu$m), an n-type InGaAsP optical waveguide layer 55 (cladding layer) ($\lambda$g=1.05 $\mu$m; thickness: 150 nm), an undoped InGaAsP MQW active layer 56, a p-type InP cladding layer 58, a p-type InGaAsP contact layer 59, and a p-type electrode 60 which are laminated on the n-type InP substrate 51 in this order. The n-type InAsP light absorption layers 52 absorb the light from the MQW active layer 56.

The modulation part 72 includes an n-type InGaAsP optical waveguide layer 55 ($\lambda$g=1.05 $\mu$m; thickness: 70 nm), an undoped InGaAsP light modulation layer 57, a p-type InP cladding layer 58, and a p-type electrode 61 which are laminated on the n-type InP substrate in this order. The n-type InP substrate 51 has an n-type electrode 62 on a bottom surface thereof.

The undoped InGaAsP MQW active layer 56 has a well thickness of 8 nm and a PL wavelength of 1.31 μm, and the undoped InGaAsP light modulation layer 57 has a well thickness of 4 nm and a PL wavelength of 1.25 μm.

The DFB laser 1000 has the same structure with the DFB laser 80D shown in FIG. 22 except for the n-type InAsP light absorption layers 52 forming the diffraction grating.

The n-type InAsP light absorption layers 52 are formed in stripes in accordance with corrugations formed at a top surface of the n-type InP substrate 51. Each stripe of the n-type InAsP light absorption layers 52 are extended in a direction perpendicular to the cavity length direction and selectively formed in an area corresponding to the emission part 71. The n-type InAsP light absorption layers 52 each have a maximum thickness of 20 nm (effective $\lambda g=1.6$ μm) in the groove of the corrugations but have a thickness of only several nanometers or less (PL wavelength>1.3 μm) on the ridge of the corrugations. The thickness of the n-type InAsP light absorption layers 52 changes periodically in accordance with the corrugations of the n-type InP substrate 51. Thus, the thickness of the n-type InAsP light absorption layers 52 changes periodically in accordance with the positional change in the bandgap. In this example, the n-type InAsP light absorption layers 52 need not be separated from each other, but it is sufficient as long as the thickness thereof changes periodically in the cavity length direction. The n-type InAsP light absorption layers 52 can be separated from each other, in which case no layer is existent on the ridges of the corrugations. In the modulation part 72, the thickness of the n-type InAsP light absorption layers 52 is 4 nm.

A method for producing the DFB laser 1000 will be described with reference to FIGS. 25A through 25C.

Figure 25A:
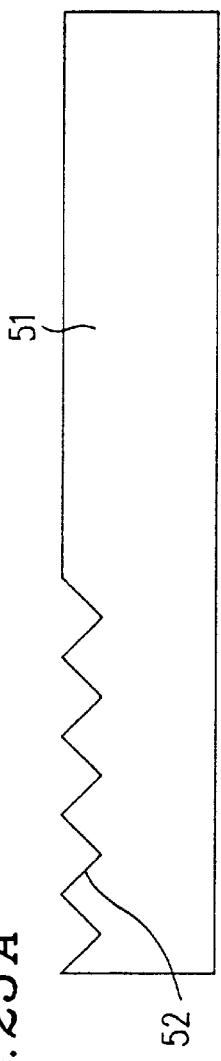
FIG. 25A is a cross sectional view of a semiconductor substrate having corrugations in the DFB laser in the tenth example.
Figure 25B:
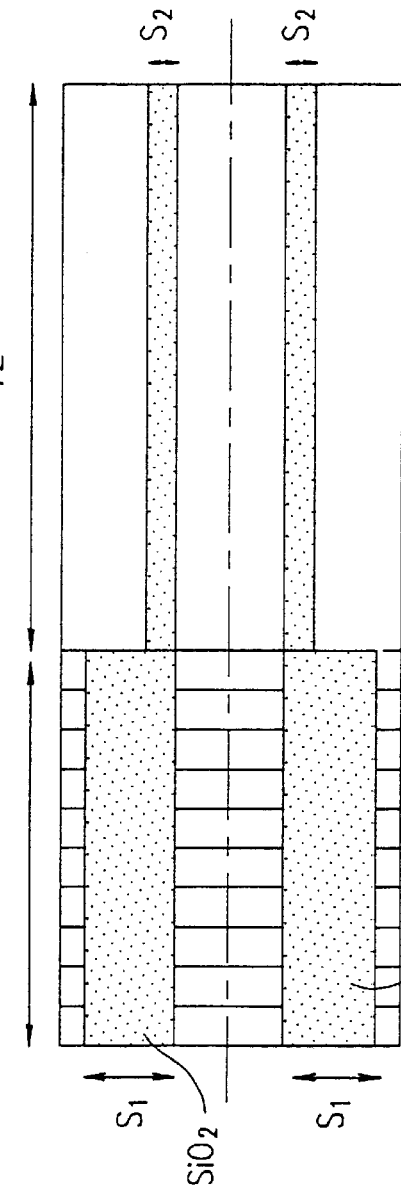
FIG. 25B is a plan view of a striped mask used in the production in the DFB laser in the tenth example.
Figure 25C:
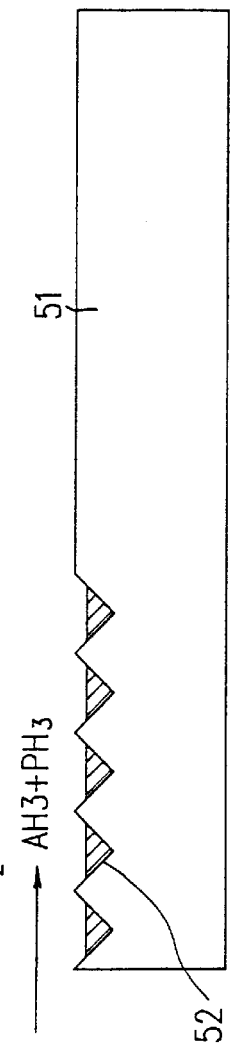
FIG. 25C is a cross sectional view of the semiconductor substrate provided with an InAsP layer in the DFB laser in the tenth example.

As is shown in FIG. 25A, on an area of a top surface of the n-type InP substrate 51 corresponding to the emission part 71, corrugations having a pitch of 230 nm and a maximum depth of approximately 50 to 100 μm are selectively formed by holographic exposure and etching to form the diffraction grating.

Next, as is shown in FIG. 25B, on such a corrugated top surface of the n-type InP substrate 51, an SiO$_2$ mask having a pair of stripes extending in the cavity length direction is formed. In the area corresponding to the emission part 71, each stripe has a width of 30 μm and is arranged with an opening therebetween having a width of 10 μm. In the area corresponding to the modulation part 72, each stripe has a width of 10 μm and are arranged with an opening therebetween having a width of 10 μm. Each stripe is wider in the area corresponding to the emission part 71 than in the area corresponding to the modulation part 72.

Next, a hydrogen atmosphere is supplied with 100% phosphine (PH$_3$) at a rate 100 cc/min. and 10% arsine (AsH$_3$) at a rate of 10 cc/min. In the resultant atmosphere, the n-type InP substrate 51 is heated at 600° C. As a result, as is shown in FIG. 25C, the InAsP absorption layers 52 having a thickness of approximately 50 nm are formed in the grooves of the corrugations to form a diffraction grating. Then, the n-type InGaAsP optical waveguide layer 55 the undoped InGaAsP MQW active layer 56, the undoped InGaAsP light modulation layer 57, the p-type InP cladding layer 58, and the p-type InP contact layer 59 are grown by MOVPE in the openings of the SiO$_2$ mask. The thickness of each layer depends on the width of the openings, and is different in the emission part 71 and the modulation part 72.

Then, in order to confine a current and light in the lateral direction, another cladding layer (not shown) is formed in the same manner as in the sixth example. An SiO$_2$ passivation film (not shown) is formed on the entire surface of the resultant lamination. Holes are formed in the SiO$_2$ passivation film in one prescribed area in the emission part 71 and one prescribed area in the modulation part 72. The p-type electrodes 60 and 61 are formed in the respective holes, and the n-type electrode 62 is formed on the bottom surface of the n-type InP substrate 51.

In such a production method, the planar layout of the striped lamination is determined by only one masking step. Further, formation of the semiconductor layers requires only one crystal growth step after the formation of the diffraction grating. Especially, the use of a mask having openings which have different widths for the emission part 71 and the modulation part 72 has a remarkable advantage that the formation of the multiple layer structure is significantly facilitated by self alignment with the openings. The advantage that the formation of the semiconductor layers requires only one continuous crystal growth step significantly simplifies the formation process of a complicated integrated structure, since the crystal growth is one of the most time and labor consuming process steps in the production of the laser.

EXAMPLE 11

Next, referring to FIG. 26, a distributed Bragg reflective laser (DBR) laser in the eleventh example according to the present invention will be described. FIG. 26 is a cross sectional view along the cavity length direction of a DBR laser in the eleventh example according to the present invention.

The DBR laser shown in FIG. 26 has a similar configuration to that of the DFB laser shown in FIG. 24. The DBR laser shown in FIG. 26 is different from the DFB laser shown in FIG. 24 in that an n-type InAsP layer 152 of this example does not form a diffraction grating for a distributed feedback, but a diffraction grating for a distributed Bragg reflection (DBR). A plurality of n-type InAsP layers 152 are periodically arranged at a pitch of 243 nm, and is surrounded by InP. The DBR diffraction grating is provided in a waveguide part 70. The light having a selected wavelength of the light formed by the emission part 71 is reflected by a reflector of the waveguide part 70 so as to oscillate at a unitary wavelength.

An undoped InGaAs MQW active layer 56 has the same structure as that of the active layer 56 shown in FIG. 21, and generates laser light having a wavelength of 1.55 μm. In this example, the bandgap of the n-type InAsP layers 152 is adjusted so as not to absorb the laser light.

Therefore, the plurality of n-type InAsP layers 152 form a structure where a refractive index periodically changes, i.e., a Bragg reflector, in the waveguide part 70. An electrode is not required to be provided on the waveguide part 70. However, if an electrode is provided on the waveguide part 70, a forward bias is applied and a current is supplied, then the difference in the refractive indices in the diffraction grating is varied in accordance with the amount of the current. As a result, the wavelength of the laser light can be tuned.

EXAMPLE 12

Figure 27:
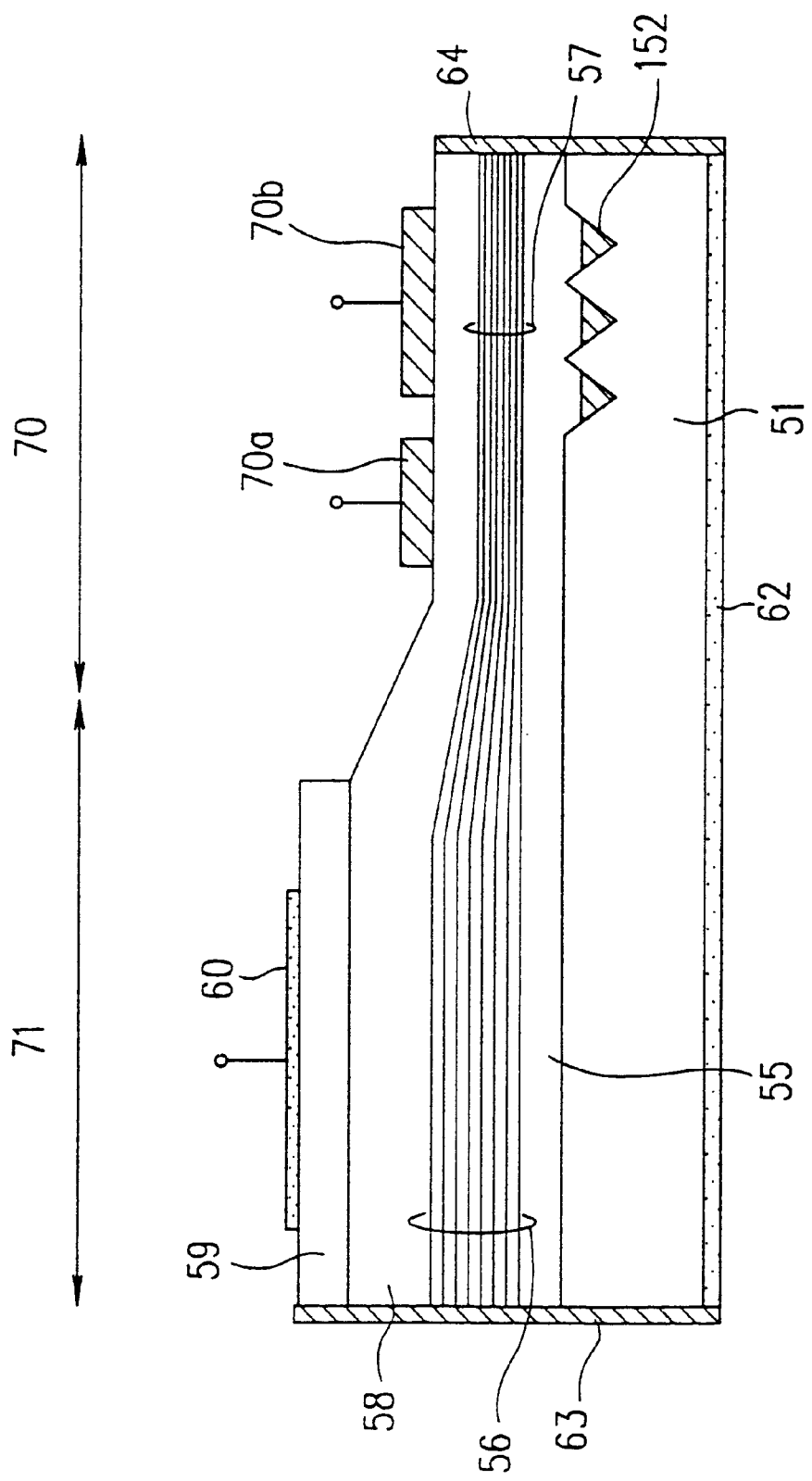
FIG. 27 is a cross sectional view of a DBR laser in a twelfth example.

Next, referring to FIG. 27, a DBR laser in a twelfth example according to the present invention will be described. FIG. 27 is a cross sectional view along the cavity length direction of a DBR laser in the twelfth example according to the present invention.

The DBR laser shown in FIG. 27 has a similar configuration to that of the DBR laser shown in FIG. 26. The DBR laser shown in FIG. 27 is different from the DBR laser shown in FIG. 26 in that a phase control electrode 70a and a wavelength tuning electrode 70b are provided on the waveguide part 70 in this example. The phase control electrode 70a is disposed on a region of the waveguide part 70 where the diffraction grating is not provided.

In increasing the forward voltage applied between the wavelength tuning electrode 70b and the electrode 62, a sudden discontinuous change is sometimes caused in the oscillation wavelength. The phase control electrode 70a functions for preventing such a discontinuous change of the oscillation wavelength. If a forward voltage is applied between the phase control electrode 70a and the electrode 62, then the discontinuous change of the oscillation wavelength can be prevented.

The DFB lasers described in the fifth through tenth examples generate laser oscillation at 1.3 μm and in the vicinity thereof using InGaAsP/InP materials. The present invention is applicable to DFB lasers designed for other wavelength ranges, such as 1.55 μm and in the vicinity thereof.

The bandgap and thickness of each semiconductor layer can be changed within the scope of the present invention. The present invention is applicable to a DFB laser formed of AlGaAs/GaAs and other materials as well.

As has been described so far, a DFB laser according to the present invention generates laser oscillation having a single wavelength, and the oscillation mode is not changed much by the light returning from outside or affected by noise.

In a production method of a DFB laser according to the present invention, periodical light absorption layers are formed without etching. Accordingly, the semiconductor layers formed after the light absorption layers have satisfactory quality and are reliable for a long period of time. The thickness and the positional arrangement of the light absorption layers are controlled more precisely due to the elimination of etching in the formation thereof. The whole production process is simplified and is used for various types of DFB lasers.

According to the present invention, DFB lasers which provide a sufficiently low level of wavelength chirp and thus can be designed with more flexibility in terms of the spectral line width are produced at a high production yield. Such a method for producing various type of light sources having a single wavelength and an excessively low level of wavelength chirp by a very simple process is valuable in practice.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser, comprising an InP substrate and a multiple layer structure formed on a main surface of the InP substrate, wherein:

the multiple layer structure comprises at least an active layer for emitting laser light and a periodical structure for distributed feedback of the laser light, the periodical structure comprises a plurality of semiconductor regions each having a substantially triangular cross section in a direction perpendicular to the main surface of the InP substrate and parallel to a cavity length of the semiconductor laser, the triangular cross section projecting toward the InP substrate, and the semiconductor regions are set to have a bandgap energy which is smaller than the energy of light emitted from the active layer, and the semiconductor regions are formed of InAsP, each one of the semiconductor regions having a thickness of more than 10 nm.

2. A semiconductor laser according to claim 1, wherein the periodical structure is provided between the InP substrate and the active layer.

3. A semiconductor laser according to claim 1, wherein the semiconductor regions are provided in an InP cladding layer.

4. A semiconductor laser according to claim 1, wherein the semiconductor regions are provided between an InP cladding layer and an InGaAsP optical waveguide layer.

5. A semiconductor laser according to claim 1, wherein the active layer has a quantum well structure comprising at least a well layer and a barrier layer.

6. A semiconductor laser according to claim 5, wherein a compression strain is induced into the well layer.

7. A semiconductor laser according to claim 6, wherein the compression strain is induced at 0.5 to 1.5%.

8. A semiconductor laser according to claim 1, wherein the semiconductor regions are formed at least of a first semiconductor material having a bandgap energy which is smaller than the energy of light emitted from the active layer and a second semiconductor material having a bandgap energy which is larger than the energy of the light.

9. A semiconductor laser according to claim 1, wherein the semiconductor regions have an average refractive index which is substantially equal to the refractive index of InP.

10. A semiconductor laser according to claim 8, wherein the semiconductor regions are provided in an InP cladding layer.

11. A semiconductor laser according to claim 8, wherein the semiconductor regions are provided between an InP cladding layer and an InGaAsP optical waveguide layer.

12. A semiconductor laser according to claim 8, wherein the active layer has a quantum well structure comprising at least a well layer and a barrier layer.

13. A semiconductor laser according to claim 12, wherein a compression strain is induced into the well layer.

14. A semiconductor laser according to claim 13, wherein the compression strain is induced at 0.5 to 1.5%.

15. A semiconductor laser according to claim 8, wherein the first semiconductor material is InAsP, and the second semiconductor material is InGaP.

16. A semiconductor laser according to claim 1, wherein the semiconductor regions are formed at least of a first semiconductor material having a bandgap energy which is smaller than the energy of light emitted from the active layer and a second semiconductor material compensating for refractivity of the first semiconductor material.

17. A semiconductor laser according to claim 1, wherein the periodical structure includes periodical corrugations, and the semiconductor regions are provided in concave portions of the periodic corrugation so as to be separated from each other.

18. A semiconductor laser according to claim 17, wherein a height of the semiconductor regions is less than a height of the periodical corrugations.

19. A semiconductor laser, comprising an InP substrate and a multiple layer structure formed on a main surface of the InP substrate, wherein:

the multiple layer structure comprises at least an active layer for emitting laser light and a periodical structure for distributed feedback of the laser light, the periodical structure comprises a plurality of semiconductor regions each having a substantially triangular cross section in a direction perpendicular to the main surface of the InP substrate and parallel to a cavity length of the semiconductor laser, the triangular cross section projecting toward the InP substrate, and the semiconductor regions are formed of InAsP and set to have a bandgap energy which is equal to or larger than the energy of light emitted from the active layer.

20. A semiconductor laser according to claim 19, wherein the periodical structure includes periodical corrugations, and the semiconductor regions are provided in concave portions of the periodic corrugation so as to be separated from each other.

21. A semiconductor laser according to claim 20, wherein a height of the semiconductor regions is less than a height of the periodical corrugations.

22. A semiconductor laser according to claim 19, where in the periodical structure is provided between the InP substrate and the active layer.

23. A semiconductor laser according to claim 19, wherein the semiconductor regions are provided in an InP cladding layer.

24. A semiconductor laser according to claim 19, wherein the semiconductor regions are provided between an InP cladding layer and an InGaAsP optical waveguide layer.

25. A semiconductor laser according to claim 19, wherein the active layer has a quantum well structure comprising at least a well layer and a barrier layer.

26. A semiconductor laser according to claim 25, wherein a compression strain is induced into the well layer.

27. A semiconductor laser according to claim 26, wherein the compression strain is induced at 0.5 to 1.5%.

28. A semiconductor laser, comprising:

a striped multiple layer structure comprising a light emission part for emitting laser light and a modulation part which is optically coupled with the emission part for modulating the laser light; and a semiconductor substrate for supporting the striped multiple layer structure, wherein:

the emission part comprises an active layer and a plurality of semiconductor regions respectively provided in concave portions of periodical corrugations disposed in a direction of an optical axis so as to be separated from each other, the semiconductor regions being set to have a bandgap energy which is smaller than the energy of light emitted from the active layer, the semiconductor regions being formed of InAsP, each one of the semiconductor regions having a thickness of more than 10 nm, and the modulation part comprises a light modulation layer having optical characteristics which change in accordance with a modulation signal.

29. A semiconductor laser according to claim 28, wherein:

the striped multiple layer structure comprises a multiple quantum well layer, the active layer in the emission part comprises a first part of the multiple quantum well layer, and the light modulation layer in the modulation part comprises a second part of the multiple quantum well layer.

30. A semiconductor laser according to claim 29, wherein the active layer in the emission part and the light modulation layer in the modulation part are connected to each other by a third part of the multiple quantum well layer located between the first part and the second part.

31. A semiconductor laser according to claim 29, wherein the first part of the multiple quantum well layer is thicker than the second part of the multiple quantum well layer.

32. A semiconductor laser according to claim 28, wherein the semiconductor regions function as a plurality of light absorption layers each having a substantially triangular cross section projecting toward the InP substrate so as to constitute an absorption type diffraction grating arranged in the direction of the optical axis.

33. A semiconductor laser according to claim 32, wherein the plurality of light absorption layers each have a thickness changing periodically in the direction of the optical axis and have a bandgap changing periodically in accordance with the periodical change in the thickness.

34. A semiconductor laser according to claim 33, wherein the light absorption layers have a quantum well structure.

35. A semiconductor laser according to claim 28, wherein the semiconductor regions are grown on the periodical corrugations.

36. A semiconductor laser according to claim 28, wherein the semiconductor regions are provided between the active layer and the semiconductor substrate.

37. A semiconductor laser according to claim 28, wherein the active layer is provided between the semiconductor regions and the semiconductor substrate.

38. A semiconductor laser according to claim 28, further comprising an optical waveguide layer provided between the active layer and the semiconductor regions.

39. A semiconductor laser according to claim 28, further comprising a first voltage application device for applying a substantially constant voltage to the emission part and a second voltage application device for applying a modulation voltage to the modulation part.

40. A semiconductor laser, comprising:

a striped multiple layer structure comprising a light emission part for emitting laser light and an optical waveguide part which is optically coupled with the light emission part for propagating the laser light therethrough; and a semiconductor substrate for supporting the striped multiple layer structure, wherein:

the light emission part comprises an active layer radiating the laser light, the optical waveguide part comprises a Bragg reflector where a refractive index periodically changes along an optical axis direction, and the Bragg reflector comprises an InAsP layer formed in concave portions of periodical corrugations formed on the semiconductor substrate so as to reflect light having a selected wavelength of the laser light radiated from the active layer of the light emission part toward the active layer.

41. A semiconductor laser according to claim 40, wherein the InAsP layer has a bandgap not to absorb the laser light.

42. A semiconductor laser according to claim 41, wherein the optical waveguide part comprises a wavelength tuning part for adjusting a wavelength of the laser light.

43. A semiconductor laser according to claim 42, wherein the optical waveguide part comprises a phase control part for adjusting a phase of the laser light.

44. A semiconductor laser, comprising:

a striped multiple layer structure, comprising a light emission part for emitting laser light and a modulation part which is optically coupled with the emission part for modulating the laser light; and a semiconductor substrate for supporting the striped multiple layer structure, wherein the emission part comprises an active layer and a plurality of semiconductor regions respectively provided in concave portions of periodical corrugations disposed in a direction of an optical axis so as to be separated from each other, the semiconductor regions being formed of InAsP and set to have a bandgap energy which is equal to or larger than the energy of light emitted from the active layer, and the modulation part comprises a light modulation layer having optical characteristics which change in accordance with a modulation signal.

45. A semiconductor laser comprising:

a striped multiple layer structure, comprising a light emission part for emitting laser light and a modulation part which is optically coupled with the emission part for modulating the laser light; and a semiconductor substrate for supporting the striped multiple layer structure, wherein the emission part comprises an active layer, the modulation part comprises a light modulation layer having optical characteristics which change in accordance with a modulation signal, an absorption type diffraction grating periodically arranged in the optical axis direction, provided in the emission part and the modulation part, and the laser light emitted from the active layer is not substantially absorbed at the absorption type diffraction grating in the modulation part.

* * * * *